(12) United States Patent
Ross

(10) Patent No.: US 10,582,635 B1
(45) Date of Patent: Mar. 3, 2020

(54) PORTABLE DATA CENTER

(71) Applicant: Amazon Technologies, Inc., Seattle, WA (US)

(72) Inventor: Peter George Ross, Olympia, WA (US)

(73) Assignee: Amazon Technologies, Inc., Seattle, WA (US)

( * ) Notice: Subject to any disclaimer, the term of this patent is extended or adjusted under 35 U.S.C. 154(b) by 828 days.

(21) Appl. No.: 14/613,796

(22) Filed: Feb. 4, 2015

(51) Int. Cl.
H05K 7/14 (2006.01)
G06F 1/30 (2006.01)
G06F 1/26 (2006.01)
H02J 9/06 (2006.01)

(52) U.S. Cl.
CPC .......... *H05K 7/1492* (2013.01); *G06F 1/263* (2013.01); *G06F 1/30* (2013.01); *H02J 9/06* (2013.01); *H05K 7/1497* (2013.01)

(58) Field of Classification Search
CPC .... H02J 3/00; H02J 4/00; G06F 1/189; G06F 1/26; G06F 1/263; H05K 7/1497; H05K 7/1492

See application file for complete search history.

(56) References Cited

U.S. PATENT DOCUMENTS

| | | | |
|---|---|---|---|
| 6,813,897 B1 | 11/2004 | Bash et al. | |
| 7,141,894 B2 * | 11/2006 | Kraus | H02J 9/066 307/65 |
| 7,738,251 B2 * | 6/2010 | Clidaras | G06F 1/20 165/80.4 |
| 8,251,785 B2 * | 8/2012 | Schmitt | H05K 7/1497 361/695 |
| 8,384,244 B2 | 2/2013 | Peterson et al. | |
| 8,937,405 B2 | 1/2015 | Park | |
| 8,947,879 B2 * | 2/2015 | Broome | H05K 7/1497 165/104.33 |
| 9,485,887 B1 | 11/2016 | Eichelberg et al. | |
| 2006/0082263 A1 * | 4/2006 | Rimler | B60P 3/14 312/201 |
| 2006/0284489 A1 | 12/2006 | Gross et al. | |
| 2010/0165565 A1 | 7/2010 | Hellriegal et al. | |
| 2010/0328850 A1 | 12/2010 | Remmert | |
| 2013/0032310 A1 * | 2/2013 | Jaena | F28D 15/02 165/104.25 |
| 2014/0213169 A1 * | 7/2014 | Rasmussen | H05K 7/1497 454/237 |
| 2016/0172900 A1 | 6/2016 | Welch, Jr. | |
| 2016/0181861 A1 | 6/2016 | Familiant et al. | |

\* cited by examiner

Primary Examiner — Ryan Johnson
(74) Attorney, Agent, or Firm — BakerHostetler

(57) ABSTRACT

A portable data center is configured to be powered using one or more external power sources. The portable data center includes at least one interconnect member, at least one electrical circuit, and an electrical power bus. The at least one interconnect member is configured for connecting the portable data center to the one or more external power sources. The at least one electrical circuit and electrical power bus are in electrical communication with the at least one interconnect member and are housed within a container of the portable data center. The at least one electrical circuit is configured to convert power received from the one or more external power sources at a first voltage level to conditioned power at a second, lower voltage level. The electrical power bus distributes power from the conditioned power to computing devices housed within the container.

22 Claims, 10 Drawing Sheets

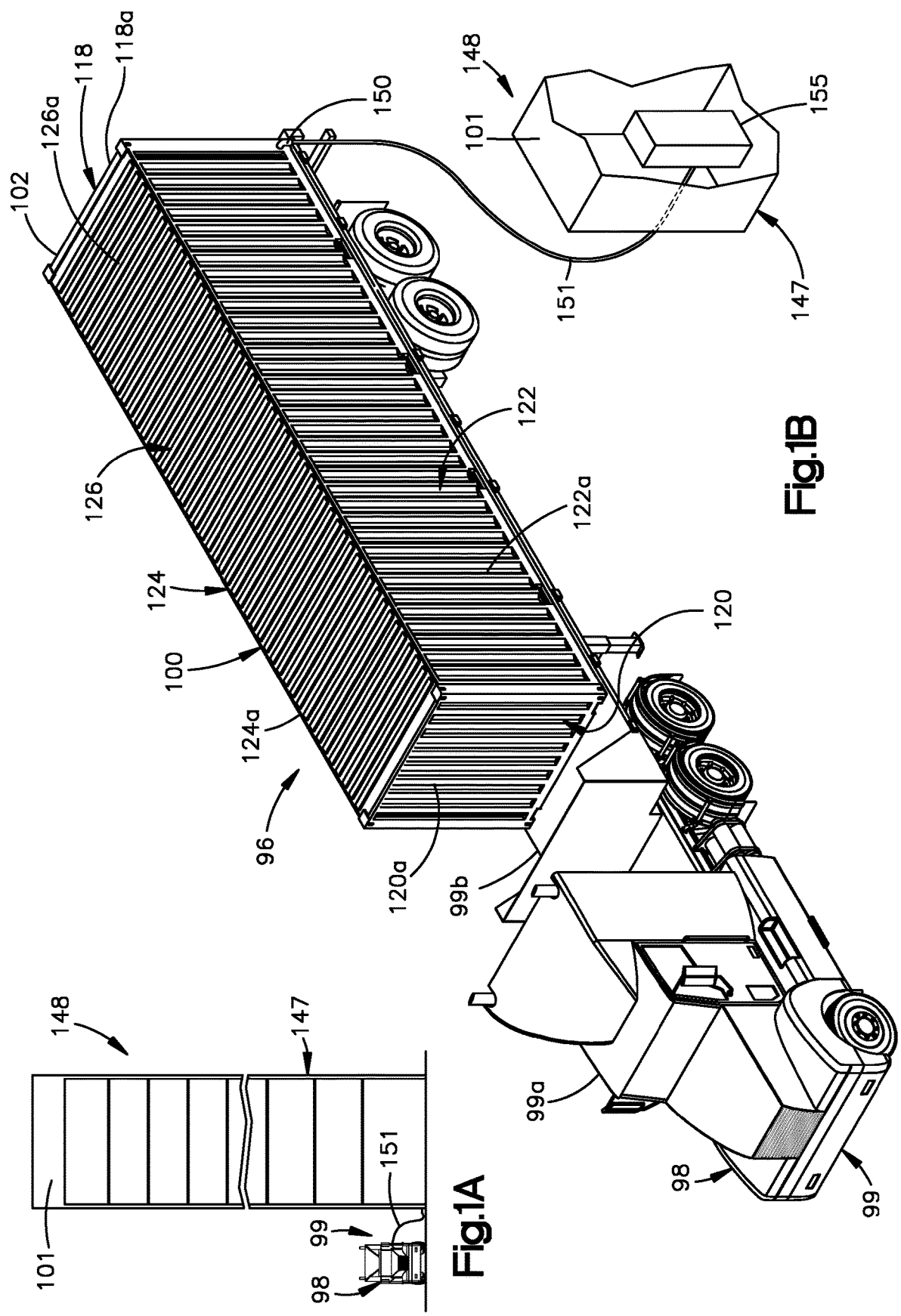

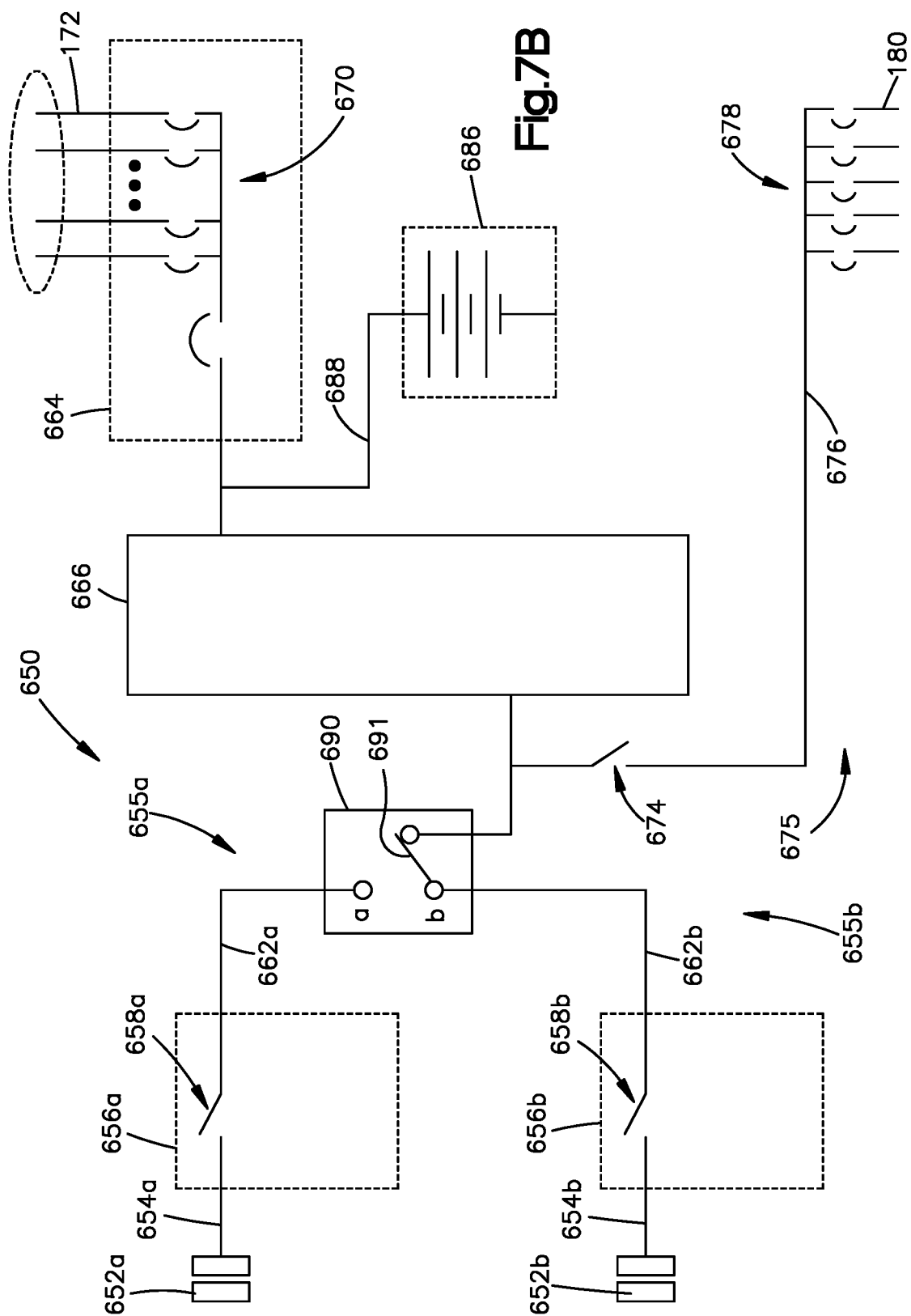

US 10,582,635 B1

PORTABLE DATA CENTER

BACKGROUND

Computing-intensive or data-intensive organizations such as on-line retailers, Internet service providers, search providers, financial institutions, and the like often conduct computer operations from large scale computing facilities, known as data centers. Such computing facilities house and accommodate a large number of server, network, and other computer equipment suitable to process, store, and exchange data as desired to facilitate the organization's operations. It can be useful to expand an existing data center, or prepare a new data center, as quickly as possible.

BRIEF DESCRIPTION OF THE DRAWINGS

The following detailed description will be better understood when read in conjunction with the appended drawings, in which there is shown in the drawings example embodiments for the purposes of illustration. It should be understood, however, that the present disclosure is not limited to the precise arrangements and instrumentalities shown. In the drawings:

FIG. 1A is a schematic perspective view of a mobile data storage system constructed in accordance with one embodiment, including a mobile vehicle and a portable data center supported by the mobile vehicle, showing the portable data center connected to a computing device of a client at a client location over a hardwire communication line;

FIG. 1B is an enlarged schematic perspective view of the mobile data storage system illustrated in FIG. 1A, showing the portable data center connected to the computing device, showing only a portion of the client location;

FIG. 7B is a schematic diagram of an electrical power system of the portable data center of FIG. 7A in accordance with one embodiment.

DETAILED DESCRIPTION

Figure 2A:
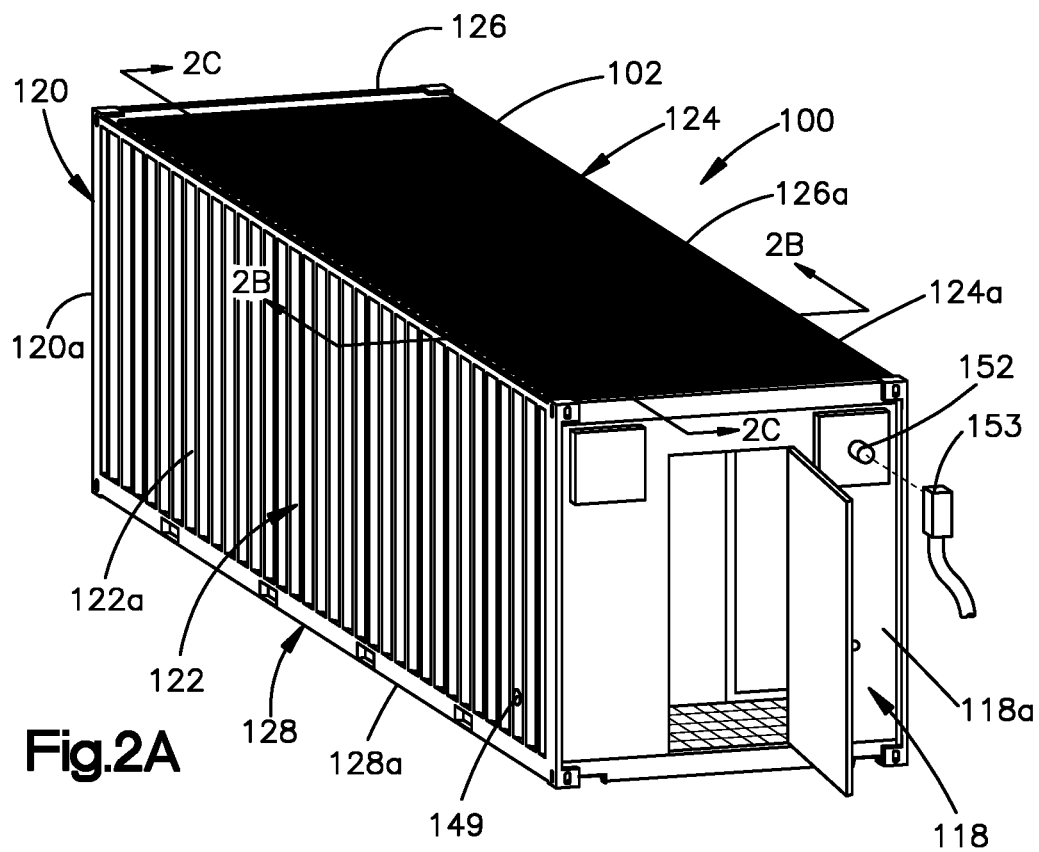
FIG. 2A is a perspective view of a portable data center constructed in accordance with one embodiment.

Systems and methods in accordance with various embodiments of the present disclosure relate to a portable data center that is capable of being transported to a remote client location and transmitting data between the client location and computing devices aboard the portable data center. For example, in various embodiments, the transport can occur on a trailer, other road vehicle, boat, train, airplane, or any suitable mobile vehicle.

More specifically, embodiments of the present disclosure relate to the powering of the portable data center using one or more power sources that are external to the portable data center. In at least one embodiment, the portable data center includes at least one interconnect member, at least one electrical circuit, and an electrical power bus. The at least one interconnect member is configured for connecting the portable data center to the one or more external power sources. The at least one electrical circuit and electrical power bus are in electrical communication with the at least one interconnect member and are housed within a container of the portable data center. The at least one electrical circuit is configured to convert power received from the one or more external power sources at a first voltage level to conditioned power at a second voltage level, lower than the first voltage level. The electrical power bus distributes power from the conditioned power to computing devices housed within the container of the portable data center.

In some embodiments, the portable data center can include a single interconnect member for coupling to a single power source and a single instance of the electrical circuit such that the portable data center is not protected against failure of the electrical circuit. Embodiments employing a single instance of the electrical circuit may be useful, for example, when the external power source implements an uninterruptible power supply (UPS) that protects against failures at the external power source, when fault tolerance is not desired (e.g., when the criticality of the processes carried out by the computing devices inside the portable data center is relatively low), or when cost is an issue.

In other embodiments, the portable data center can include redundant (e.g., primary and backup) components such as at least first and second interconnect members for connecting to at least first and secondary external power sources and at least first and second instances of the electrical circuit. In such embodiments, the portable data center may be protected against one or more failures of the external power sources and/or one or more failures of the electrical circuits. Embodiments employing redundant components may be useful when, for example, fault tolerance is desired (e.g., when the criticality of the processes carried out by the computing devices inside the portable data center is relatively high). However, such embodiments may be more costly than embodiments that do not implement redundant components.

In yet further embodiments, the portable data center can include an on-board power supply, such as a battery backup unit, to power the portable data center when the portable data center is being switched between at least first and second power sources.

In yet still further embodiments, the portable data center can further include a cooling system, or portions thereof, that is configured to remove heat dispensed from the computing devices during operation.

In even yet still further embodiments, the portable data center can include a data management system, or portions thereof, that is configured to receive data from the remote location over a conduit and deliver the received data to one or more of the computing devices aboard the remote data center.

Embodiments of the portable data center described herein may be used to add additional computing capacity to an existing non-portable (i.e., fixed) data center housed in, for example, a building. In at least some such uses, one or more instances of the portable data center can be installed by (a) establishing an electrical connection with an existing electrical power source, and possibly an existing cooling system, that supplies the building and/or the fixed data center, and (b) receiving electrical power available from excess capacities of the existing power sources and cooling system available. Such existing power sources might or might not include a UPS. Further, embodiments of the portable data center described herein may be used temporarily to meet a need for computing capacity while a fixed data center is constructed. In such uses, existing UPS and cooling systems might or might not be available, depending on the timing of construction. Yet further, embodiments of the portable data center described herein may be used to assemble a more permanent portable data center in a modular format that includes multiple portable data centers. It is recognized that in such uses, existing UPS and cooling systems might or might not be available to supply power to the portable data centers.

As used herein, "portable data center" includes any transportable facility or portion of a facility in which computer operations are carried out. The portable data center may include one or more systems, or portions thereof, for carrying out the computer operations. These systems may include (without limitation) one or more of an electrical power system, a data communication system, and environmental control systems such as a cooling system and/or a fire protection system. A portable data center may also include servers dedicated to specific functions or serving multiple functions. Examples of computer operations include information processing, communications, testing, simulations, power distribution and control, and operational control.

As used herein, "computing room" refers to a room in a data center in which at least one rack resides. The room can be fully or partially defined by at least one computing room wall in the data center, or can be defined by an open space in a data center. The computing room wall can be disposed within the data center, or can be defined by an exterior wall of the data center.

As used herein, "rack housing" refers to a housing that at least partially defines an interior space within which at least one rack resides.

As used herein, "rack" refers to a rack, container, frame, bracket, plurality of brackets, shelving, or any other element or combination of elements that can contain or physically support one or more computing devices.

As used herein, "computing device" includes any of various devices in which computing operation or data storage can be performed. One example of a computing device is a rack-mounted server. As used herein, the term computing device is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. Some examples of computing devices include e-commerce servers, network devices including routers, telecommunications equipment, medical equipment, electrical power management and control devices, and professional audio equipment (digital, analog, or combinations thereof). In the various embodiments, memory may include, but is not limited to, a computer-readable medium, such as a random access memory (RAM). Alternatively or additionally, memory may include a compact disc-read only memory (CD-ROM), a magneto-optical disk (MOD), and/or a digital versatile disc (DVD). Also, additional input channels may include computer peripherals associated with an operator interface such as a mouse and a keyboard. Alternatively, other computer peripherals may also be used that may include, for example, a scanner. Further, in some embodiments, additional output channels may include an operator interface monitor and/or a printer.

As used herein, "hardwire communication line" refers to any electrical wire, cable, or the like that is configured to receive and transmit data. Hardwire communication lines can include copper cabling, fiber cabling, or any alternative cabling suitable for data transfer.

Referring to FIGS. 1A-2C, a mobile data storage system 96 can include a mobile vehicle 98, and a portable data center 100 that is configured to be removably supported by the mobile vehicle 98. The mobile vehicle 98 can be configured as any suitable self-propelled land motor vehicle, such as a truck 99 of the type including a self-propelled tractor 99a and trailer 99b that is towed by the tractor 99a as illustrated. Alternatively, the land vehicle can be configured as any alternatively constructed truck, train or any alternative suitably constructed land vehicle as desired. Alternatively still, the vehicle can be configured as a water vehicle, such as a ship, an air vehicle such as an airplane, or any alternative vehicle suitable to transport the portable data center 100 as described herein. Thus, the portable data center 100 can be supported by the mobile vehicle 98, which can include on the mobile vehicle 98, for instance on the trailer 99b, or in the mobile vehicle 98, for instance in a train car, a compartment of an airplane, in an enclosed trailer, or the like.

The portable data center 100 includes a portable container 102 having a generally rectangular or any suitable exterior shape as desired. For instance, portable container 102 can include first and second opposed end walls 118 and 120, respectively, opposed first and second side walls 122 and 124, respectively, a top wall 126, and a bottom wall 128 opposite the top wall 126. The first end wall 118 can define a rear end wall of the portable container 102, and the second end wall 120 can define a front end wall of the portable container 102. The first end wall 118 can define a first exterior end surface 118a, and the second end wall 118 can define respective a second exterior end surface 120a. Similarly, the first side wall 122 can define a first exterior side surface 122a, and the second side wall 124 can define a second exterior side surface 124a. Similarly, the top wall 126 can define an exterior top surface 126a, and the bottom wall 128 can define an exterior bottom surface 128a. It should be appreciated that the exterior surfaces of the portable container 102 can combine to define a generally rectangular exterior shape, or any suitable alternative exterior shape as desired. The portable container 102 can be constructed and dimensioned as an international standards organization (ISO) shipping container such as a twenty-foot equivalent unit (TEU) container or a forty-foot equivalent unit (FEU) container. However, it will be understood that, in alternative embodiments, the portable container 102 may be any other suitable portable container having any suitable size and any suitable shape for housing a computing room. In at least some embodiments, the portable container 102 may vary between about eight feet and 56 feet in length and between about eight feet and nine feet, six inches in height.

The portable container 102 further defines an internal cavity 104. For example, the portable container 102 can define interior surfaces opposite the exterior surfaces. In particular, the first and second end walls 118 and 120 can define a first interior end surface 118b and a second interior end surface 120b, respectively. Similarly, the first and second side walls 122 and 124 can define a first interior side surface 122b and a second interior side surface 124b, respectively. Similarly, the top wall 126 and the bottom wall 128 can define an interior top surface 126b and an interior bottom surface 128b, respectively. The interior top surface 126b can define a ceiling of the internal cavity 104. The interior bottom surface 128b of the bottom wall 128 can define a floor of the internal cavity 104. Thus, it should be appreciated that the interior surfaces of the portable container 102 can combine to define the internal cavity 104, which can be entirely enclosed, or can be open to the external ambient environment as desired. It should be further appreciated that while the interior and exterior surfaces of the portable container 102 can be defined by the same wall as described above, the interior and exterior surfaces can alternatively be defined by different walls. For instance, various ones of the interior and exterior surfaces can be defined by walls that are disposed adjacent each other.

The portable container 102, and thus the portable data center 100, can include a computing room 106 that is supported within the internal cavity 104. For instance, the computing room 106 can be defined by a plurality of interior walls including the opposed first and second end walls 118 and 120, the opposed first and second side walls 122 and 124, respectively, the top wall 126, the bottom wall 128, and a partition wall 107 that is disposed between the first and second end walls 118 and 120. It will be appreciated that the interior partition wall 107 may define a door that allows passage into and out of the computing room 106 to and from a void 105 that is disposed between the first end wall 118 and the partition wall 107. Further, the first end wall 118 can define a door that provides for passage in and out of the void 105, and thus the internal cavity 104. Note that, in alternative embodiments, the computing room 106 may be defined by a set of walls that is different from that discussed above. For example, the interior partition wall 107 may be omitted or moved, and the set of walls may include additional or fewer walls as desired.

Figure 2B:
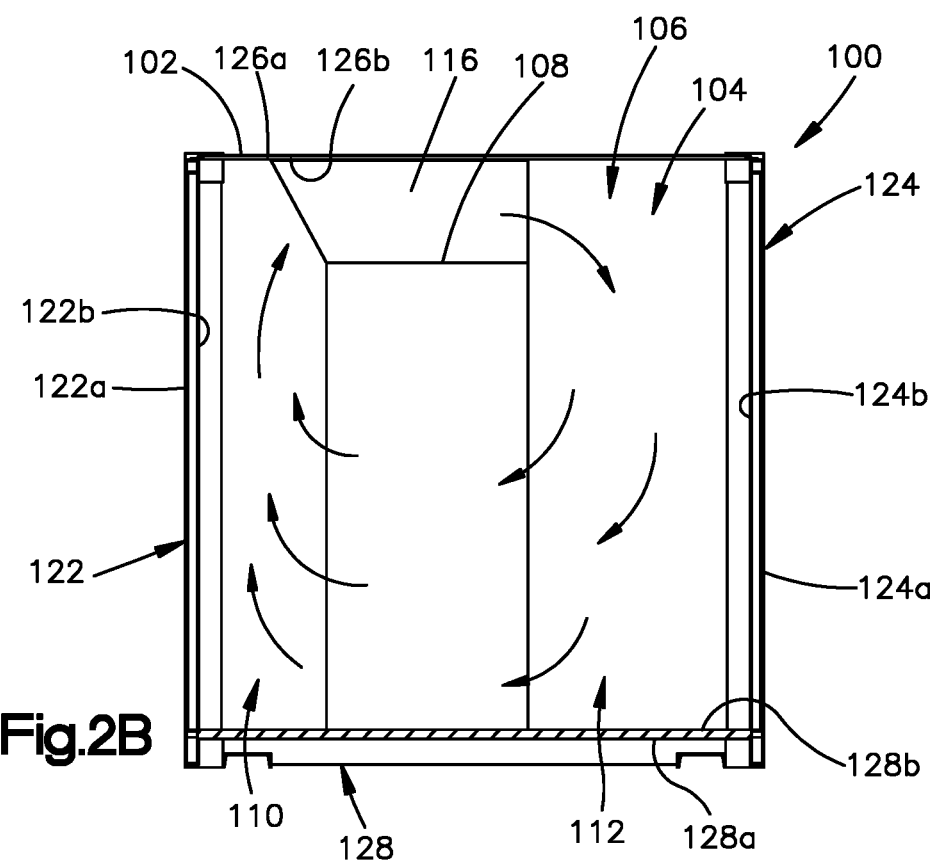
FIG. 2B is a sectional end elevation view of the portable data center of FIG. 1A, taken along line 2B-2B.
Figure 2C:
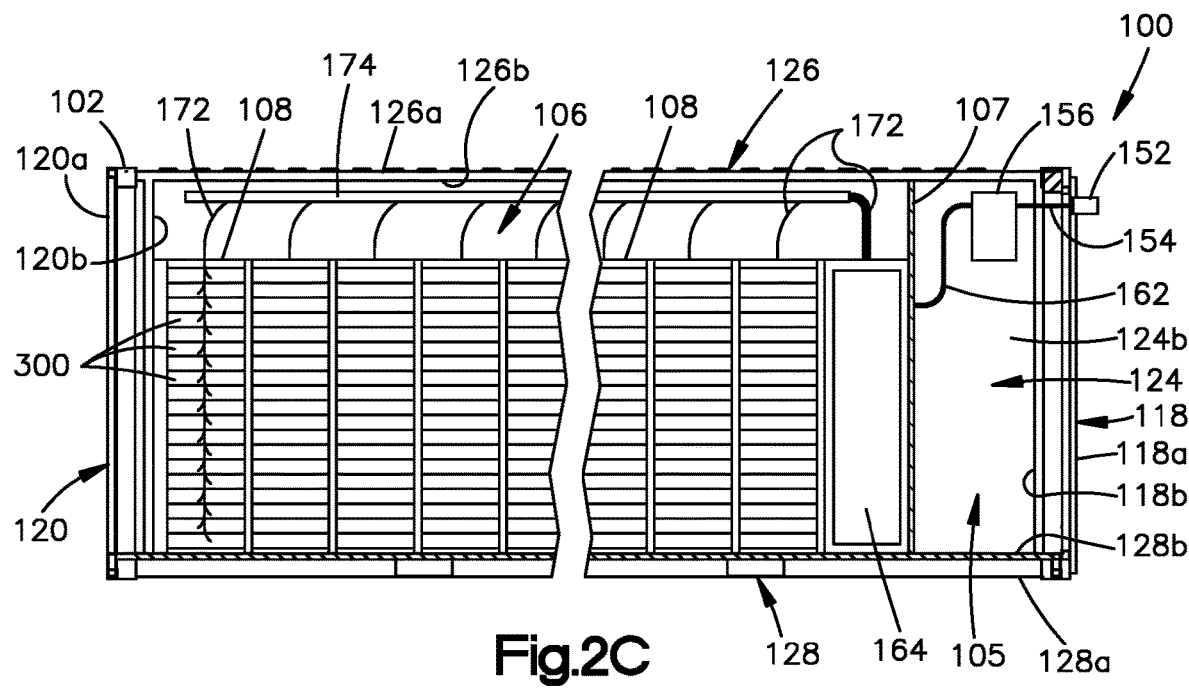
FIG. 2C is a sectional side elevation view of the portable data center of FIG. 2A, taken along line 2C-2C.

Referring to FIG. 2C, the portable data center 100 further includes at least one rack system 108, such as a plurality of rack systems 108 disposed in the computing room 106. Each rack system 108 is configured to support one or more computing devices 300. The computing devices 300 can, for instance, be configured as network devices, data storage devices, or any suitable alternative computing devices as desired. Each of the plurality of rack systems 108 can be supported, directly or indirectly, by the interior bottom surface 128b. The rack systems 108 can be arranged side-by-side to form an aisle of rack systems between first and second walls of the portable data center 100 that define the computing room 106. The first and second walls can be defined by the second end wall 120 and the interior partition wall 107. Further, as shown in FIG. 2B, the rack systems 108 are spaced from the interior surface 122b, and are further spaced from the interior surface 124b. Thus, the computing room 106 can define a hot air aisle 110 that is disposed between the rack systems 108 and the interior surface 122b. The computing room 106 can further define a cold air aisle 112 that is disposed between the rack systems 108 and the interior surface 124b. It should be understood that, according to alternative embodiments, the portable data center 100 can include other arrangements of rack systems 108 as desired. For example, the portable data center 100 can include as few as one rack system 108, a plurality of rack systems 108 that are arranged in more than one row, or even a plurality of rack systems 108 that do not abut one another side-by-side.

Figure 3:
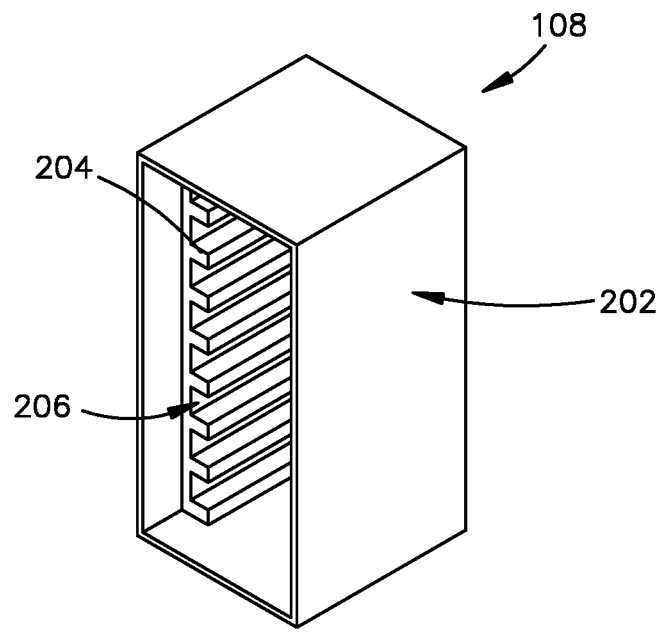
FIG. 3 is a perspective view of a rack system of the portable data center illustrated in FIG. 2A, constructed in accordance with one embodiment.

Referring also to FIG. 3, the rack system 108 includes a rack housing 202 and one or more respective racks 204 supported by the rack housing 202. Each rack 204 can define a plurality of bays 206 that are each configured to receive a computing device (e.g., a computing device 300 in FIG. 2C) that is supported by the rack 204. It should be appreciated that the rack 204 can define any suitable alternative shape and size as desired so as to support the computing devices in any alternative manner as desired.

It should be appreciated that, depending on a desired storage capacity of the portable data center 100, the portable data center 100 can include any number of computing devices 300 as desired up to the capacity of the portable data center 100. Accordingly, one or more of the rack systems 108 up to all of the rack systems 108 can include at least one computing devices 300 supported by the respective rack system 108. For instance, one or more of the rack systems 108 up to all of the rack systems 108 can include a plurality of computing devices 300 supported in a corresponding one of each of the bays 206 of the rack system 108. Furthermore, one or more of the rack systems 108 can be devoid of computing devices 300 if desired.

In one embodiment, the computing devices 300 may comprise one or more servers configured to store data. In at least some such embodiments, these servers may be configured as disk storage. As a further example of a disk storage device, the computing devices 300 may be configured as a set of low cost disk memories wherein sets of disks within the computing device 300 may be in operation while at least one other set of disks in computing device 300 are not in operation. In such an example, operating only a portion of the disks in example computing devices 300 may provide energy consumption benefits.

In another embodiment, the computing devices 300 may comprise a higher speed memory, such as a block-level storage service. A block-level storage service may process requests to read to and write from disk via a network link. In effect, storage drivers of other computing devices may access the block-level storage service as if the block-level storage service were a local disk. The block-level storage service may present a network-mountable storage volume to these other computing devices, and these other computing devices may mount this network-mountable storage volume, and issue requests to read to and write from this volume as if it were a local disk. In an embodiment, the computing devices 300 may comprise a combination of low and high speed (or high IOPS, or other metric) memory devices. As such, as one example, data may be loaded onto the high speed memory devices during connection with the building at the customer location and, after being detached from building, the memory may be transferred from the high speed devices to the low speed devices.

Referring also again to FIGS. 1A-1B, the mobile vehicle 98, and thus the portable data center 100 supported by the mobile vehicle 98, is configured to be transported to a remote destination location 147, which can be a client location 148, in response to a data storage request that is received from a client. The portable data center 100 can include a data port 149 that extends through the portable container 102 and is configured to be connected to, and thus placed in connection with, a hardwire communication line 151 that is further configured to be connected, directly or indirectly, to at least one client computing device 155 at the client location 148, which can be configured as a data center. The hardwire communication line 151 can be a fiber optic cable, co-axial cable, Ethernet cable, or any suitable alternatively constructed hardwire communication line suitable to transmit data from the client location 148 to the portable data center 100. Thus, the data port 149 is configured to receive data from the client at the client location over the hardwire communication line 151. In particular, the data can be received from at least one client computing device 155 at the client location 148 that is also connected to the hardwire communication line 151, alone or in combination with at least one or more computing devices at a location that is remote from the client location 148 but networked with one or more computing devices at the client location 148. The client location 148 can be a building 101, and the at least one client computing device 155 can be located anywhere in the building or at any other location that is in communication with a network in the building.

The data port 149 can extend through the portable container 102 of the portable data center 100 at any suitable location as desired. The data port 149 is in communication with at least one network device that is supported in at least one of the rack systems 108, such that the network device is configured to route the received data to at least one of the data storage devices, such as respective ones of the computing devices 300 supported by the racks 204 of others of the plurality of rack systems 108. In accordance with one embodiment, the hardwire communication line 151 can be connected to a data port of the building 101, which in turn is connected to the at least one client computing device 155 over another hardwire communication line so as to permit data communications between at least one of the computing devices, for instance the at least one network device, and the at least one client computing device 155 of the client. The portable data center 100 can further include a protective shroud that at least partially or entirely surrounds the data port 149 and can protect the data port 149 from climactic elements, including snow and rain. It should be appreciated that the portable data center 100 can further include wireless communication modules suitable to communicate with a remote location, for instance to receive control information from the remote location. The control information can include data management information, such as storage protocol that manages the distribution of data from the network devices to the data storage devices, or any suitable alternative information related to the operation of the portable data center 100.

Figure 4:
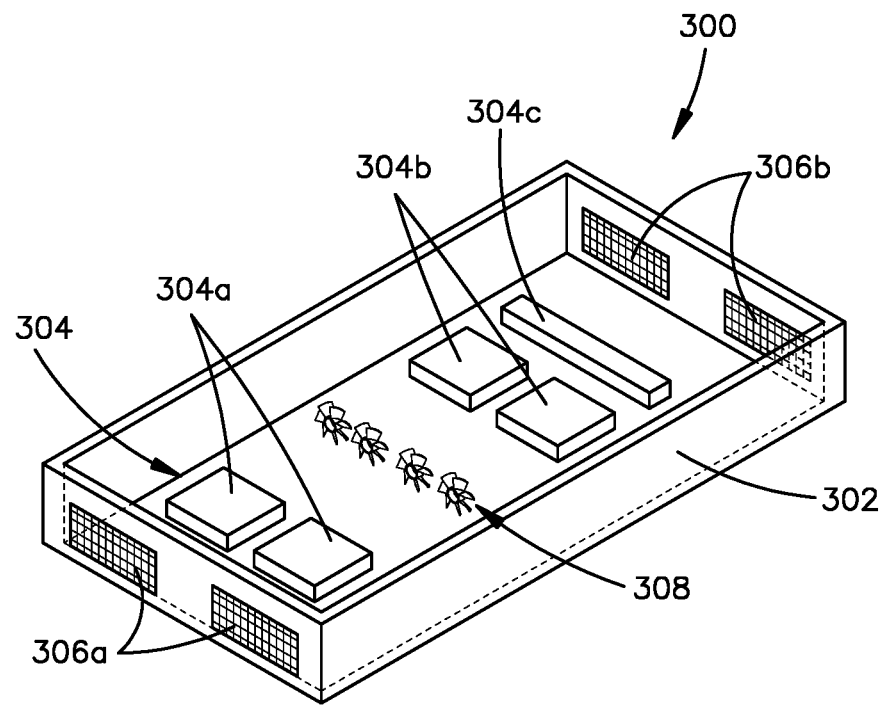
FIG. 4 is a perspective view of a computing device configured to be supported by the rack system illustrated in FIG. 3.

Referring to FIG. 4, the computing device 300 includes an outer housing 302, a top portion of which is removed for illustrative purposes. The outer housing 302 houses a plurality of electrical components 304 of the computing device 300. For instance, electrical components 304 can include one or more hard drives 304a, processors 304b, and memory modules 304c. Each of the electrical components 304 can produce heat during operation of the computing device 300. The computing devices 300 can further include at least one air intake 306a that can be configured as a vent that extends through the outer housing 302, at least one air outlet 306b that can be configured as a vent that extends through the outer housing 302, and at least one fan such as a plurality of internal fans 308 that are configured to draw air from the computing room through the air intake 306a. The drawn air travels through the outer housing 302 and is exhausted from the outer housing 302 through the air outlet 306b, and subsequently out the computing housing 302 out the at least one air outlet 306b. As the air travels through the outer housing 302, heat is transferred from the electrical components 304 to the air, thereby removing heat from the electrical components 304. Accordingly, the temperature of the air is increased as it travels through the outer housing 302. Because the air that exists the outer housing 302 has a temperature greater than the air before being drawn into the outer housing 302, the air can be referred to as cold air prior to being drawn through the computing device 300, and can be referred to as hot air after being exhausted from the outer housing 302.

Referring again to FIGS. 2B and 2C, the portable data center 100 includes one or more components 116 of a cooling system for providing cooling to the portable data center 100. In particular, the cooling system is configured to direct cold air into the cold air aisle 112 that flows into the computing devices 300, and is exhausted as hot air from the computing devices 300 into the hot air aisle 110. The cooling system can be configured as an open system, whereby the hot air is exhausted from hot air aisle and out the data center 100. Alternatively, the cooling system can be configured as a closed system whereby the hot air flows from the hot air aisle 110, heat is removed from the hot air to produce cold air, and the cold air is fed back into the cold air aisle 112. Accordingly, the one or more components 116 of the cooling system may include mechanical equipment such as blowers that force hot air exhausted from the computing devices 300 into the hot air aisle 110 and returning cold air to the cold air aisle 112. The components 116 of the cooling system can further include heat exchangers or other heat removal apparatus that remove heat from the hot air to generate the cold air. The components 116 of the cooling system can further include ducting to facilitate circulation of the hot and cold air. In some embodiments, the one or more components 116 of the cooling system may include all of the components that provide cooling to the computing room 106, such that the portable data center 100 may be operated without mechanical equipment that is external to the portable container 102. In other embodiments, one or more components 116 of the cooling system may include one or more of the components that provide cooling to the computing room 106.

As illustrated in FIG. 2B, the one or more of the components 116 of the cooling system can be disposed above of the rack systems 108, that is between the rack systems and the interior top surface 126b. Further, the one or more components 116 are shown as directing cold air to the cold air aisle 112 via a route that passes over the rack systems 108. It will be understood that the positioning of the one or more components 116 and the routing of cold air to the cold air aisle 112 is merely representative. According to alternative embodiments, the one or more components 116 may be located elsewhere within the portable container 102 and may circulate the air via routes other than that shown, including routes that draw air from outside of the portable container 102 and/or expel air outside of the portable container 102.

The portable data center 100 includes an electrical power system that is configured to provide electrical power sufficient to operate the computing devices 300. The electrical power system can further provide electrical power sufficient to operate the one or more components 116 of the cooling system. In general, and as will be described in further detail below, the electrical power system can include at least one interconnect member, at least one electrical circuit, an electrical power bus, and optionally, other suitable electrical components including (without limitation) one or more circuit breaker panels and/or transfer switches. The at least one interconnect member is configured to couple to a power source that is external to the portable container and to receive electrical power from the power source at a first voltage level. The at least one electrical circuit is supported in the portable container and is in electrical communication with the interconnect member. The at least one electrical circuit is configured to receive the electrical power at the first voltage level and produce output electrical power that is isolated from the received electrical power. The electrical circuit can further convert the received electrical power from the first voltage level to a second voltage level that is less than the first voltage level. The electrical power bus is at least partially disposed in the computing room 106 and has at least a first electrical line that receives the output electrical power from the at least one electrical circuit and a plurality of electrical lines in electrical communication with the first electrical line. Each of the plurality of electrical lines is configured to supply power from the output electrical power to a respective at least one of the computing devices 300 in at least one of the plurality of rack systems 108.

Figure 2D:
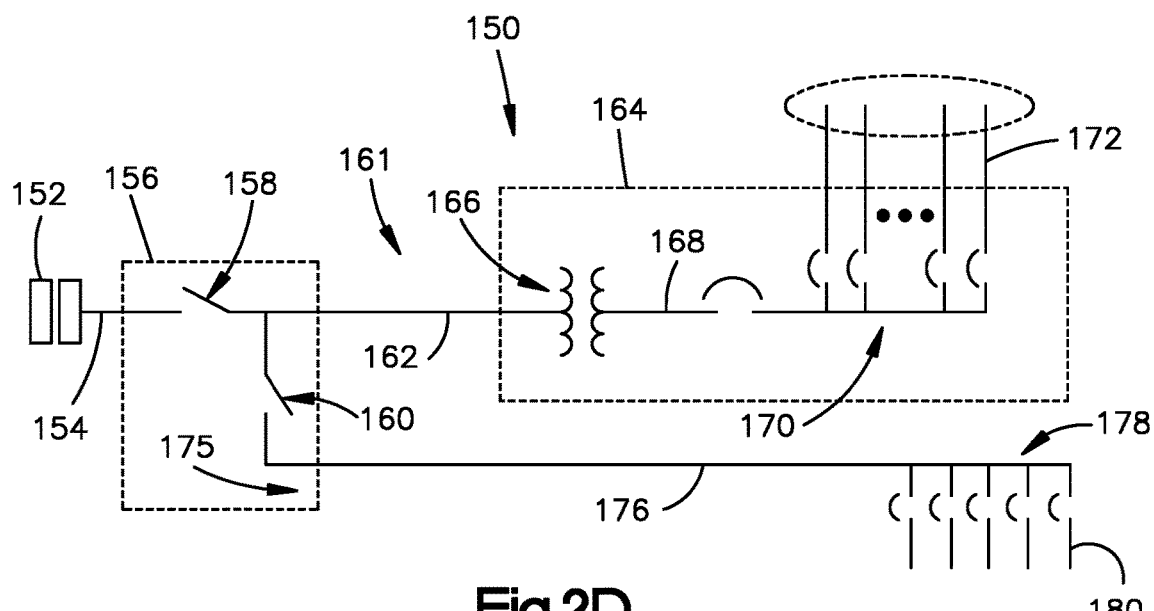
FIG. 2D is a schematic diagram of an electrical power system of the portable data center of FIG. 2A-2C, in accordance with one embodiment.

Referring now to FIGS. 2C and 2D, one example of an electrical power system 150 includes a first interconnect member 152, a circuit breaker panel 156, a computing power circuit 161, and a cooling power circuit 175, all housed within or supported by the portable container 102. As used herein, the term "computing power circuit" refers to a circuit that is configured to provide electrical power to one or more of the computing devices disposed in the portable data center 100. The term "cooling power circuit" refers to a circuit that is configured to provide electrical power to one or more components of the cooling system. Although the electrical power system 150 can include the computing power circuit 161 and the cooling power circuit 175, it will be appreciated that the electrical power system 150 can include electrical circuits in addition to or as an alternative to one or more of the computing power circuit 161 and cooling power circuit 175. For instance, in some embodiments, the electrical power system 150 can be devoid of the cooling power circuit 175, for instance in embodiments in which the powered cooling components are implemented outside of the portable container 102.

The interconnect member 152 is configured to electrically and mechanically couple the portable data center 100 to a corresponding interconnect member 153 (see FIG. 2A) of an external power source at the remote destination location 147 (see FIG. 1A). The external power source can be configured as a utility station or generator, or the like. The interconnect member 152 is configured to receive source electrical power from the external power source at the source voltage level and source amperage level, which can also be referred to as a first voltage level and a first amperage level, respectively, which can be any suitable voltage and amperage as desired. In one example, the source electrical power can be 3-phase electrical power at the source voltage level, which can be 480 Volts alternating current, and the source amperage level, which can be 300 Amps. The interconnect member 152 can be supported by, and extend out from, an exterior surface of the portable container 102. For example, the interconnect member can extend out from the first exterior end surface 118a. However, it will be understood that other configurations are envisioned whereby the portable data center 100 to be coupled to an external power source. For example, in one alternative embodiment, the interconnect member 152 may be supported by any one or more of the walls of the portable container 102. As another example, the interconnect member 152 may be flush with any of the exterior surface of the portable container 102, rather than extending outwardly therefrom. As yet another example, the interconnect member 152 may be formed at the end of a cable that extends out from one of the external surfaces of the portable container 102, where the interconnect member resides entirely outside of the portable container 102.

The electrical power system 150 can include a primary electrical line 154 that extends from the interconnect member 152 to the circuit breaker panel 156. Accordingly, electrical power received at the interconnect member 152 from the external power source travels along the primary electrical line 154 to the circuit breaker panel 156. The circuit breaker panel 156 can be supported by an interior surface of the portable container 102, or any suitable alternative structure in the internal cavity 104. For instance, in one example, the circuit breaker panel 156 can be supported by one of the first and second interior side surfaces 122b and 124b, respectively. The circuit breaker panel 156 includes electrical circuitry that is configured to selectively supply electrical power received from the external power source to at least one electrical power circuit of the electrical power system 150. For instance, the circuit breaker panel 156 can include electrical circuitry that is configured to selectively supply electrical power to one or both of the computing power circuit 161 and the cooling power circuit 175. The computing power circuit 161 is configured to provide electrical power received from the circuit breaker panel 156 to the rack systems 108 of the portable data center 100. The cooling power circuit 175 is configured to provide electrical power received from the circuit breaker panel 156 to the one or more components 116 of the cooling system.

In one example, the computing power circuit 161, and thus the electrical power system 150, includes a first electrical line 162 that is electrically connected between the circuit breaker panel 156 and a second electrical line 168 that is coupled to a plurality of auxiliary electrical lines 172 that deliver electrical power to respective ones of the rack systems 108. The cooling power circuit 175, and thus the electrical power system 150, can include a second electrical power bus 178 that includes outputs configured to electrically connect to a second plurality of auxiliary electrical lines 180 that deliver electrical power to the cooling system. The cooling power circuit 175 can further include a third electrical line 176 that is electrically connected between the circuit breaker panel 156 and the second electrical power bus 178. The circuit breaker panel 156 can include a main circuit breaker 158 that is configured to selectively electrically connect the computing power circuit 161 to the interconnect member 152, and thus to the external power source when the external power source is electrically coupled to the interconnect member 152. For instance, when the main circuit breaker 158 is in a closed position, the main circuit breaker establishes an electrical path from the primary electrical line 154 to the first electrical line 162, and thus places the interconnect member 152 in electrical communication with an electrical circuit 166 described below. When the main circuit breaker 158 is in an open position, the main circuit breaker 158 interrupts the electrical path from the primary electrical line to the first electrical line 162, such that the interconnect member 152 is electrically isolated from the electrical circuit 166.

Further, the circuit breaker panel 156 can include a branch circuit breaker 160 that is configured to selectively connect the cooling power circuit 175 to the interconnect member 152, and thus to the external power source when the external power source is electrically coupled to the interconnect member 152. For instance, when the branch circuit breaker 160 is in a closed position, the branch circuit breaker 160 establishes an electrical path from the primary electrical line 154 to the components of the cooling system. When the branch circuit breaker 160 is in an open position, the branch circuit breaker 160 interrupts the electrical path from the primary electrical line 154 to the third electrical line 176, such that the interconnect member 152 is electrically isolated from the components of the cooling system. The main circuit breaker 158 and the branch circuit breaker 160 can be configured to be in the open position simultaneously with each other, and can further be configured to be in the closed position simultaneously with each other. Further, the one of the main circuit breaker 158 and the branch circuit breaker 160 can be in the open position while the other of the main circuit breaker 158 and the branch circuit breaker 160 can be in the closed position.

The computing power circuit 161 can include the first electrical line 162, an electrical power distribution unit 164, an electrical power bus 170, and the plurality of auxiliary electrical lines 172. In one example, the electrical power distribution unit 164 can include the electrical power bus 170. The entirety of the computing power circuit 161 can be disposed entirely in the internal cavity 104. The electrical power distribution unit 164, and thus the computing power circuit 161, can further include an electrical circuit 166 disposed in the internal cavity 104 of the portable data center 100. The electrical circuit 166 is configured to be placed in electrical communication with the first interconnect member 152, for instance when the main circuit breaker 158 is in the closed position. The electrical circuit 166 is configured to receive the electrical power at the first voltage level and produce output electrical power. For instance, the electrical circuit 166 can be configured as an isolation transformer. Thus, the electrical power distribution unit 164 can include an input interface that connects to the first electrical line 162 so as to electrically couple the first electrical line to the electrical circuitry or isolation transformer.

The electrical power bus 170, and thus the electrical power distribution unit 164, can include the second electrical line 168 that is electrically connected to the isolation transformer. The electrical power bus 170, and thus the electrical power distribution unit 164, can further include any number of output interfaces as desired that are configured to electrically connect the second electrical line 168 to respective ones of the auxiliary electrical lines 172. Thus, it should be appreciated that the computing power circuit 161 can include the isolation transformer, the second electrical line 168, and the output interfaces that are configured to electrically couple the second electrical line 168 to the plurality of auxiliary electrical lines 172. The electrical power distribution unit 164 can be constructed as desired. In one example, the electrical power distribution unit 164 can be provided as an APC PDPM175G6H modular electrical power distribution unit, commercially available from American Power Conversion Corporation, having a place of business in West Kingston, R.I. As described above, the isolation transformer is electrically connected between the first electrical line 162 and the second electrical line 168. The electrical power bus 170 can further include a plurality of auxiliary electrical lines 172 that are electrically connected to the second electrical line 168. Each of the auxiliary electrical lines 172 can further be electrically bussed to a respective at least one of the rack systems 108, and thus to a respective at least one up to all of the computing devices 300 in one of the rack systems 108 or in more than one of the rack systems 108. Thus, each of the auxiliary electrical lines 172 can be electrically connected between the second electrical line and the respective at least one of the rack systems 108. It can be said that the second electrical line 168 is electrically connected between the isolation transformer and the auxiliary electrical lines 172.

It should be appreciated that the isolation transformer can receive the electrical power received over the first electrical line 162 at the first voltage level, and produce an output electrical power. The isolation transformer, or the electrical circuitry, can condition the received electrical power such that the output electrical power is at a second voltage level that is different than the first voltage level. For instance, the output electrical power can be three phase electrical power at a second voltage level that is less than the first voltage level. In one example, the second voltage level can be between 350 volts and 480 volts of alternating current, for instance 415 volts of alternating current. Alternatively, the second voltage level can be greater than the first voltage level. Accordingly, it can be said that the electrical circuit 166 can vary a characteristic of the electrical power received over the first electrical line 162. The characteristic can be a voltage level in one example. Alternatively, still the second voltage level can be equal to the first voltage level. The electrical power distribution unit (PDU) 164 can be supported at any location in the internal cavity 104 of the portable container 102 as desired.

The output electrical power from the isolation transformer is provided to the electrical power bus 170. As described above, the electrical power bus 170 can include a second electrical line 168 that receives the output power from the isolation transformer. It is appreciated that the first and second electrical lines can combine to define an electrical line that is connected between the main circuit breaker 158 and the auxiliary electrical lines 172. The isolation transformer can be connected between first and second segments of the electrical line that is connected between the main circuit breaker 158 and the auxiliary electrical lines 172. The electrical line that is connected between the main circuit breaker 158 and the auxiliary electrical lines 172 can be referred to as a computing system electrical line. The plurality of auxiliary electrical lines 172 can carry power from the second electrical line 168 to the respective computing devices 300 at any suitable voltage and amperage as desired. Further, the electrical power bus 170 can include any number of auxiliary electrical lines 172 as desired. For example, the electrical power bus 170 can include between twenty and fifty, for instance between thirty and forty, and for example thirty-six auxiliary electrical lines 172.

In one embodiment, the auxiliary electrical lines 172 can carry electrical power at a respective amperage level that is less than the amperage of the source electrical power, and can further be less than the amperage level of the output electrical power from the isolation transformer. It should further be appreciated that the amperage level carried by one or more of the auxiliary electrical lines 172 can be equal to, less than, or greater than the amperage level carried by one or more of the auxiliary electrical lines 172, depending for instance on the requirements of the various rack systems 108. In one embodiment, the auxiliary electrical lines 172 can be configured to carry electrical power at ten amps from the second electrical line 168 to the respective at least one of the rack systems 108. The electrical power carried by the auxiliary electrical lines 172 can be further by at any voltage level as desired. The voltage level can be less than the voltage level of the source power, and can be less than or equal to the voltage level of the electrical power output from the isolation transformer. In one example, the auxiliary electrical lines 172 can carry electrical power at 230 volts of alternating current to the respective at least one of the rack system 108. The plurality of auxiliary electrical lines 172 can be extend along a cable tray 174 or alternative suitable organizer at any location in the internal cavity 104 as desired. For instance, the auxiliary electrical lines 172 can extend along the interior top surface 126b, along the interior bottom surface 128b, along an interior side surface, or other location as desired.

The cooling power circuit 175 can include a second electrical power bus 178 that includes a second plurality of auxiliary electrical lines 180. In this regard, the plurality of auxiliary electrical lines 172 can be referred to as a first plurality of electrical lines. The cooling power circuit 175 can further include a third electrical line 176 that receives electrical power from the branch circuit breaker 160 at any suitable voltage level and amperage level as desired. For instance, the voltage level on the third electrical line 176 can be equal to the first voltage level or different than the first voltage level. Further, the amperage level on the third electrical line 176 can be equal to the first amperage level or different than the first amperage level. In one example, the voltage level on the third electrical line 176 can be 480 volts of alternating current, and the amperage level on the third electrical line can be less than the first amperage level, such as 90 Amps. Each of the second plurality of auxiliary electrical lines 180 can carry electrical power from the third electrical line 176 to respective ones or more of the components 116 of the cooling system. The electrical power carried on the second plurality of auxiliary electrical lines 180 can have a voltage level equal to or less than the voltage level on the third electrical line 176 at a current level that is equal to or less than the current level on the third electrical line 176.

As described above with respect to FIG. 2D, the computing power circuit 161 can include the isolation transformer, the second electrical line 168, and the output interfaces of the electrical power bus 170 that couple the second electrical line 168 to the auxiliary electrical lines 172. For instance, in one embodiment, the computing power circuit 161 includes the electrical power distribution unit 164 that, in turn, includes the isolation transformer, the second electrical line 168, and the electrical power bus 170. Accordingly, the isolation transformer, the second electrical line 168, and the electrical power bus 170 can be supported by a common housing that is supported in the internal cavity 104 of the portable data center 100. Alternatively, it is recognized that the computing power circuit can include the electrical circuitry, or isolation transformer, and an electrical power bus without including an electrical power distribution unit.

Figure 5A:
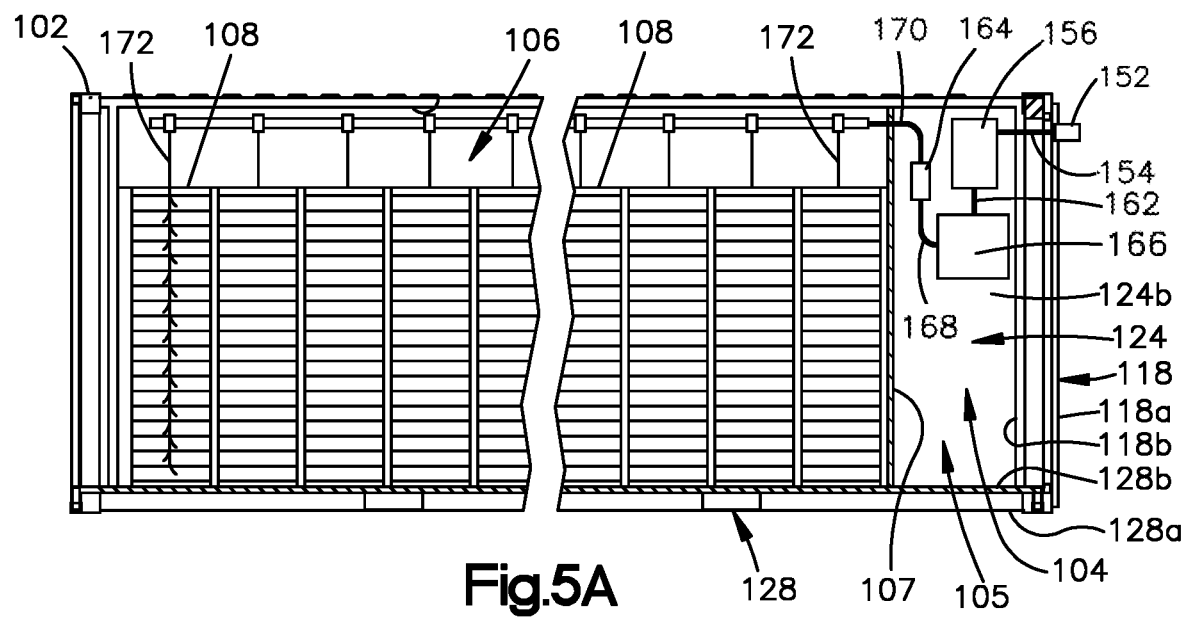
FIG. 5A is a sectional side elevation view of a portion of the portable data center illustrated in FIG. 2C, but including a computing power circuit constructed in accordance with an alternative embodiment.
Figure 5B:
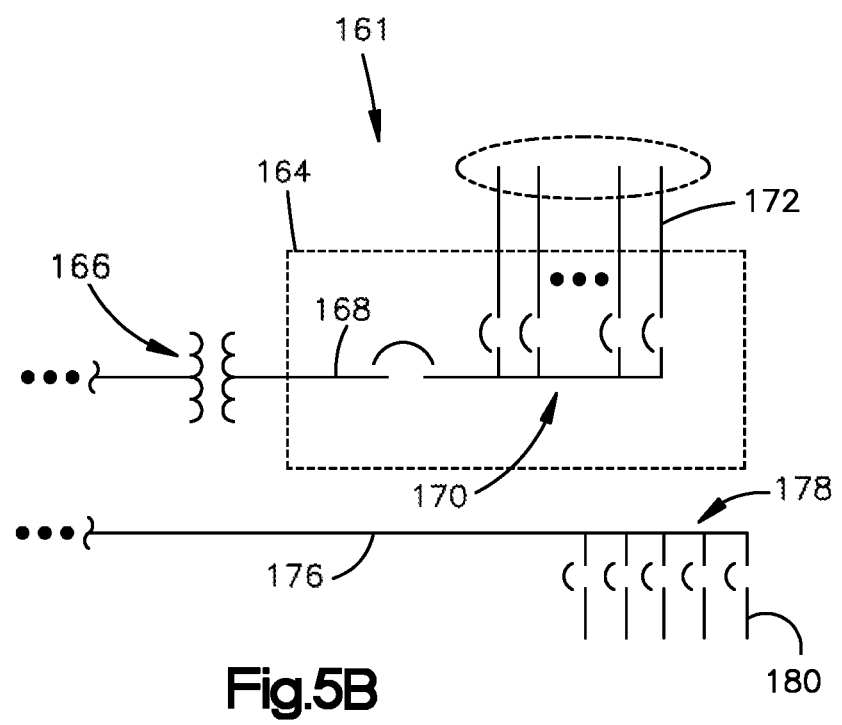
FIG. 5B is a schematic diagram of a portion of the electrical power system of the portable data center as illustrated in FIG. 2D, but including the computing power circuit illustrated in FIG. 5A.

For instance, referring to FIGS. 5A-5B, the computing power circuit 161 can include the isolation transformer and the electrical power bus 170 supported by separate housings that are, in turn, supported in the internal cavity 104 of the portable data center. As described above, the isolation transformer can condition the received electrical power such that the output electrical power is at a second voltage level that is different than the first voltage level. For instance, the output electrical power can be three phase electrical power at a second voltage level that is less than the first voltage level. In one example, the second voltage level can be between 350 volts and 480 volts of alternating current. For instance, the second voltage can be 400 volts of alternating current. Alternatively, as described above, the second voltage level can be equal to or greater than or equal to the first voltage level.

The electrical power bus 170 can be constructed as desired. In one example, the electrical power bus 170 can be a Starline® Track Busway commercially available from Universal Electric Corporation, having a place of business in Canonsburg, Pa. The electrical power bus 170 can include an input interface configured to electrically connect to the second electrical line 168, and a plurality of output interfaces that are configured to electrically connect to respective ones of the plurality of auxiliary electrical lines 172. Thus, the electrical power bus 170 receives electrical power from the second electrical line 168 at the second voltage level. The output interfaces can be configured to deliver electrical power to the respective ones of the auxiliary electrical lines 172 at any suitable voltage as desired. For instance, the voltage delivered to the auxiliary electrical lines 172 can be less than the second voltage. In one example, the output interfaces are configured to deliver electrical power to the auxiliary electrical lines 172 at 230 volts of alternating current at any suitable amperage level as desired. For instance, the amperage level can be 10 Amps or any suitable alternative amperage level as desired.

Figure 6A:
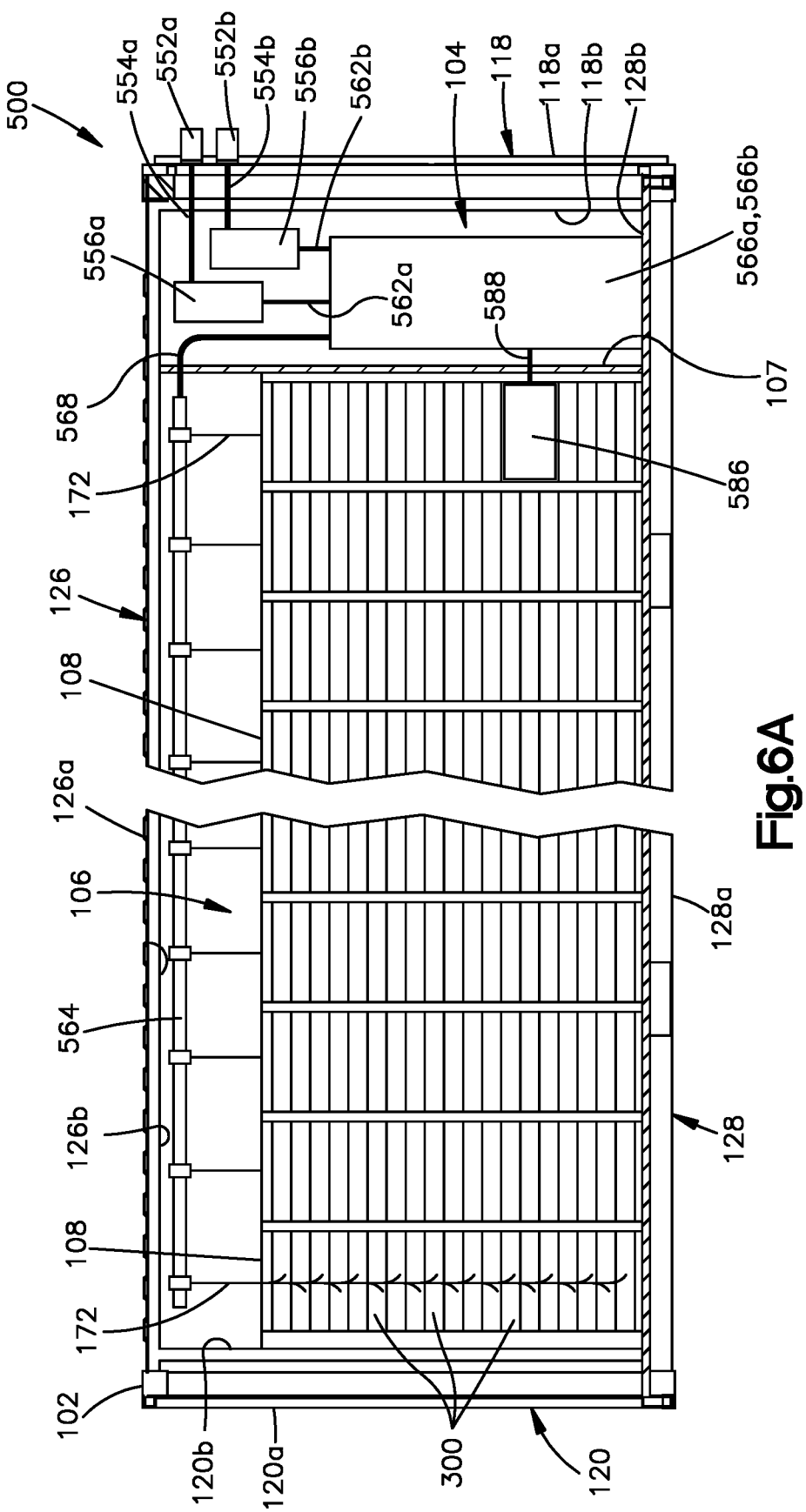
FIG. 6A is a sectional side elevation view of a portable data center constructed in accordance with yet another embodiment.

Referring now to FIG. 6A, a portable data center 500 includes the portable container 102 described above with respect to FIGS. 2A and 2B, which defines the internal cavity 104 and computing room 106. Accordingly, the portable data center 500 includes the rack systems 108, the computing devices 300, and the one or more components 116 of the cooling system as described above, and an electrical power system 550, all of which are supported by the portable container 102. The electrical power system 550 is configured to connect to both a first electrical power source such as a utility station and a second electrical power source such as an electrical power generator. The electrical power system 550 can, for instance, receive electrical power from the electrical power generator in the event of a failure to receive electrical power from the first power source (for example, during a power outage). Accordingly, the electrical power system 550 can be configured to receive electrical power from redundant electrical power sources.

The electrical power system 550 can include first electrical power circuitry 555a that is configured to receive electrical power from the first electrical power source, and second electrical power circuitry 555b that is configured to receive electrical power from the second electrical power source. The first electrical power circuitry 555a, and thus the electrical power system 550, can include a first interconnect member 552a, a first circuit breaker panel 556a having a first main circuit breaker 558a and a first branch circuit breaker 560a, a first computing power circuit 561a, and a first cooling power circuit 575a, all housed within or supported by the portable container. The first computing power circuit 561a is configured to provide electrical power received from the first circuit breaker panel 556a to the rack systems 108 of the portable data center 500. The first cooling power circuit 575a is configured to provide electrical power received from the first circuit breaker panel 556a to the one or more components 116 of the cooling system. The first electrical power circuitry 555a can further include a first primary electrical line 554a that extends from the first interconnect member 552a to the first circuit breaker panel 556a. Accordingly, electrical power received at the first interconnect member 552a from the first external power source travels along the first primary electrical line 554a to the first circuit breaker panel 556a.

The first main circuit breaker 558a of the first circuit breaker panel 556a is configured to selectively electrically connect the first computing power circuit 561a to the first interconnect member 552a, and thus to the first external power source when the first external power source is electrically coupled to the first interconnect member 552a. For instance, when the first main circuit breaker 558a is in a closed position, the first main circuit breaker 558a establishes an electrical path from the first primary electrical line 554a to the first computing power circuit 561a, and in particular to a first electrical line 562a described below. When the first main circuit breaker 558a is in an open position, the first main circuit breaker 558a interrupts the electrical path from the first primary electrical line 554a to the first electrical line 562a, such that electrical power received at the first interconnect member 552a is unable to flow to the first computing power circuit 561a.

The first computing power circuit 561a can include a first electrical circuit 566a, and a first electrical line 562a that is configured to be connected between the first circuit breaker panel 556a and the first electrical circuit 566a. The first computing power circuit 561a can further include a first electrical power bus 570, and a second electrical line 568a that is connected between the first electrical circuit 566a and the electrical power bus 570. The electrical power bus 570 is configured to be connected to the plurality of auxiliary electrical lines 172 that deliver electrical power to respective ones of the rack systems 108, as described above. When electrical power received from the first electrical power source is provided to the first computing power circuit 561a, the first electrical line 562a carries the electrical power from the first circuit breaker panel 556a to the first electrical circuit 566a. In this embodiment, the first electrical circuit 566a is a first rectifier that receives the electrical power over the first electrical line 562a, and produces output electrical power. The received electrical power can be at a first voltage level and a first amperage level that is provided by the first electrical power source. For instance, the first voltage level can be 480 volts of alternating current, though it should be appreciated that the first voltage level can vary as desired. The first rectifier can convert the electrical power from alternating current (AC) to direct current (DC). Further, the first rectifier can output the direct current at a second voltage level that can be less than the first voltage level. For instance, the second voltage level can be between 350 volts and 480 volts of direct current. For instance, the second voltage can be 400 volts of direct current. Accordingly, it can be said that the first electrical circuit 566a can vary a characteristic of the electrical power received over the first electrical line 562a. The characteristic can be a voltage level in one example. The characteristic can be the type of electrical current (e.g., alternating current or direct current). Alternatively, as described above, the second voltage level can be equal to or greater than or equal to the first voltage level. The first rectifier can be supported in a first rectifier rack 567a, which in turn is supported by the portable container 102 inside the internal cavity 104. The first rectifier rack 567a can be disposed within or outside the computing room 106 at any location as desired.

The output power from the first rectifier is provided to the electrical power bus 570 over the second electrical line 568a. The electrical power bus 570 can be supported in the internal cavity 104. In one example, the electrical power bus 570 can be supported in the computing room 106. The electrical power bus 570 can be constructed as desired. In one example, the electrical power bus 570 can be a Starline® Track Busway commercially available from Universal Electric Corporation, having a place of business in Canonsburg, Pa. The electrical power bus 570 can include an input interface configured to electrically connect to the second electrical line 568a, and a plurality of output interfaces that are configured to electrically connect to respective ones of the plurality of auxiliary electrical lines 172. Thus, the electrical power bus 570 receives electrical power from the second electrical line 568a at the second voltage level. The output interfaces can be configured to deliver electrical power to the respective ones of the auxiliary electrical lines 172 at any suitable voltage as desired. For instance, the voltage delivered to the auxiliary electrical lines 172 can be less than the second voltage. In one example, the output interfaces are configured to deliver electrical power to the auxiliary electrical lines 172 at 400 volts of direct current at any suitable amperage level as desired. For instance, the amperage level can be 35 Amps or any suitable alternative amperage level as desired. It should be appreciated, of course, that the first rectifier and the electrical power bus 570 can be alternatively configured as desired. For instance, the first rectifier and the electrical power bus 570 can be integrated into a single housing and supported in the internal cavity 104 as desired.

Figure 6B:
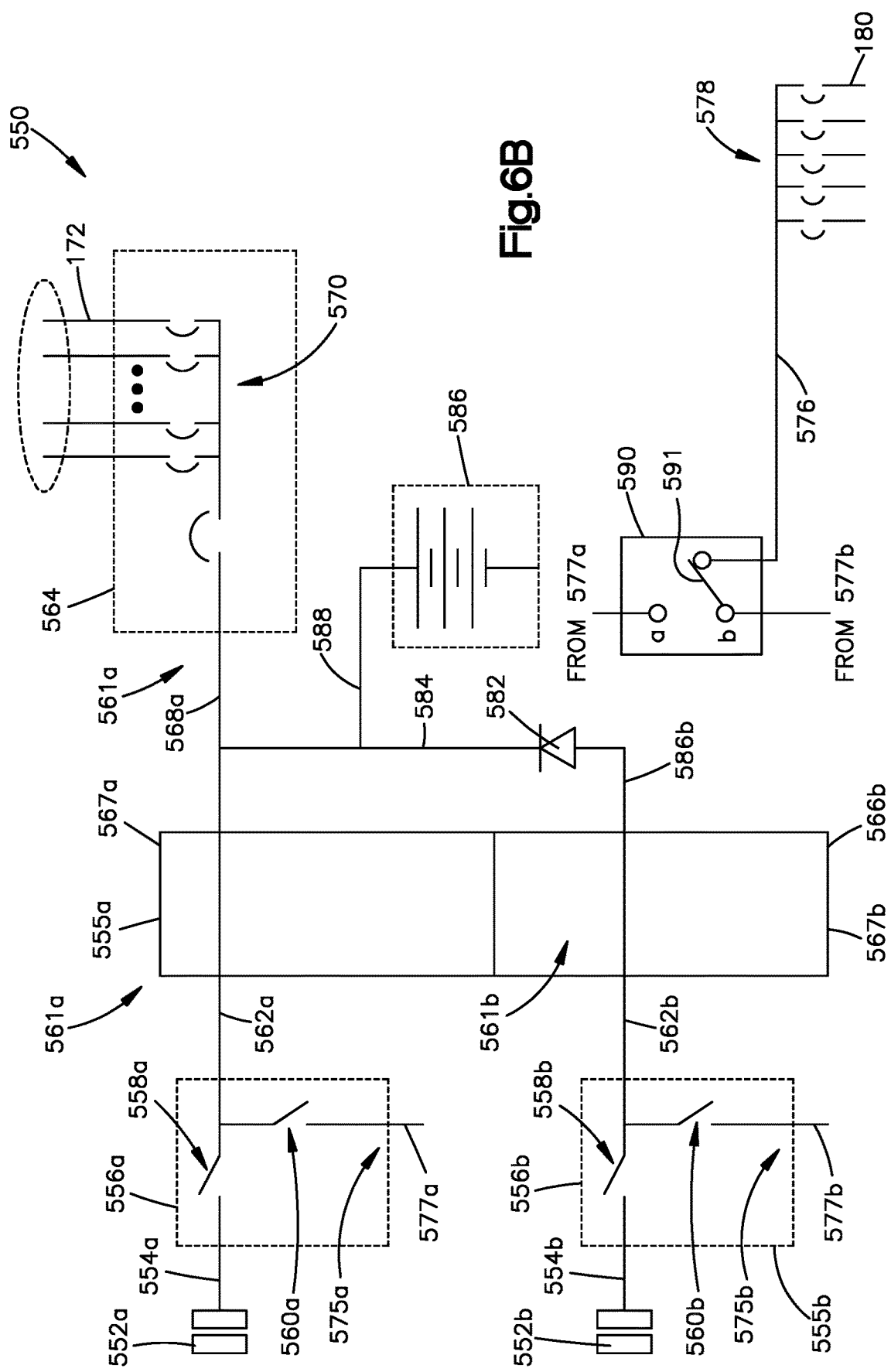
FIG. 6B is a schematic diagram of an electrical power system of the portable data center of FIG. 6A in accordance with one embodiment.

With continuing reference to FIGS. 6A-6B, the second electrical power circuitry 555b can include a second interconnect member 552b, a second circuit breaker panel 556b having a second main circuit breaker 558b and a second branch circuit breaker 560b, a second computing power circuit 561b, and a second cooling power circuit 575b, all housed within or supported by the portable container 102. It should be appreciated that the first and second circuit breaker panels 556a and 556b can be configured as first and second circuit breaker assemblies, respectively, disposed in or supported on a single physical panel, or can be disposed on or supported in two different physical panels as desired. The second computing power circuit 561b is configured to provide electrical power received from the second circuit breaker panel 556b to the rack systems 108 of the portable data center 500. The second cooling power circuit 575b is configured to provide electrical power received from the second circuit breaker panel 556b to one or more components 116 of the cooling system. The second electrical power circuitry 555b can further include a second primary electrical line 554b that extends from the second interconnect member 552b to the second circuit breaker panel 556b. Although the electrical power system 550 can include the first and second computing power circuits 561a-b and the first and second cooling power circuits 575a and 575b, it will be appreciated that the electrical power system 550 can include electrical circuits in addition to or as an alternative to one of more of the first and second computing power circuits 561a-b and the first and second cooling power circuits 575a-b. For instance, in some embodiments, the electrical power system 550 can be devoid of the first and second cooling power circuits 575a and 575b, for instance in embodiments in which the powered cooling components are implemented outside of the portable container 102.

The second main circuit breaker 558b of the second circuit breaker panel 556b is configured to selectively electrically connect the second computing power circuit 561b to the second interconnect member 552b, and thus to the second external power source when the second external power source is electrically coupled to the second interconnect member 552b. For instance, when the second main circuit breaker 558b is in a closed position, the second main circuit breaker 558b establishes an electrical path from the second primary electrical line 554b to the second computing power circuit 561b, and in particular to a second electrical line 562b described below. When the second main circuit breaker 558b is in an open position, the second main circuit breaker 558b interrupts the electrical path from the second primary electrical line 554b to the second electrical line 562b, such that electrical power from the second external power source is unable to flow through the second main circuit breaker 558b to the second computing power circuit 561b.

The second computing power circuit 561b can include a second electrical circuit 566b, and a second electrical line 562b that is configured to be connected between the second circuit breaker panel 556b and the second electrical circuit 566b. The second computing power circuit 561b can further include the electrical power bus 570, such that the electrical power bus 570 is shared by the first computing power circuit 561a and the second computing power circuit 561b. The second computing power circuit 561b can further include a second electrical line 568b that is connected between the second electrical circuit 566b and the electrical power bus 570. The second computing power circuit 561b can further include a diode 582 on the second electrical line 568b at a location between the second electrical circuit 566b and the electrical power bus 570. The diode is forward biased to allow electrical current to flow through in a direction from the second electrical circuit 566b toward the electrical power bus 570, while preventing electrical current from flowing through in a direction from the electrical power bus 570 toward the second electrical circuit 566b. When electrical power received from the second electrical power source is provided to the second computing power circuit 561b, the second electrical line 562b carries the electrical power from the second circuit breaker panel 556b to the second electrical circuit 566b. In this embodiment, the second electrical circuit 566b is a second rectifier that receives the electrical power over the second electrical line 562b, and produces output electrical power. The received electrical power can be at a first voltage level and a first amperage level that is provided by the first electrical power source. For instance, the first voltage level can be 480 volts of alternating current, though it should be appreciated that the first voltage level can vary as desired. The second rectifier can convert the electrical power from alternating current (AC) to direct current (DC). Further, the second rectifier can output the direct current at a second voltage level that can be less than the first voltage level. For instance, the second voltage level can be between 350 volts and 480 volts of direct current. For instance, the second voltage can be 400 volts of direct current. Accordingly, it can be said that the second electrical circuit 566b can vary a characteristic of the electrical power received over the first electrical line 562a. The characteristic can be a voltage level in one example. The characteristic can be the type of current flow (e.g., alternating current or direct current). Alternatively, as described above, the second voltage level can be equal to or greater than the first voltage level. The second rectifier can be supported in a second rectifier rack 567b, which in turn is supported by the portable container 102 inside the internal cavity 104. The second rectifier rack 567b can be disposed within or outside the computing room 106 at any location as desired. Further, it should be appreciated that the first and second rectifier racks can be disposed in or supported by a common physical rack, or different separate racks as desired.

The output power from the second rectifier is provided to the electrical power bus 570 over the second electrical line 568b. In particular, the output power from the second rectifier can travel from the second rectifier, along a first segment of the second electrical line 568b, through the diode 582, and along a second segment of the second electrical line 568b to the electrical power bus 570.

It is anticipated that, upon an outage of the first electrical power source, it will be desirable to maintain adequate electrical power flow to the electrical power bus 570 while switching from the first electrical power source to the second electrical power source. Accordingly, the second computing power circuit 561b, and thus the second electrical power circuitry 555b, can further include a battery back-up unit 586 that is configured to provide electrical back-up power to the electrical power bus 570, for instance when each of the first external electrical power source and the second external electrical power source fails to produce a predetermined minimum amount of electrical power to the electrical power system 550, which may occur when transitioning from the first external electrical power source to the second external electrical power source. In one example, the battery backup unit 586 can be configured as an in-row lithium-ion battery, or any suitable portable source of electrical power as desired. The second computing power circuit 561b can include a backup electrical line 588 connected between the battery back-up unit and the second electrical line 568b of the second computing power circuit 561b at a location downstream of the diode 582 (that is, between the diode 582 and the electrical power bus 570). The second electrical line 568b can electrically connect to the second electrical line 568a of the first computing power circuit 561a, or can input directly to the electrical power bus 570 as desired. When the electrical power bus 570 is not drawing electrical back-up power from the battery back-up unit 586, the battery back-up unit 586 can draw electrical power from either the first rectifier rack 567a or the second rectifier rack 567b so as to charge the battery back-up unit 586, When the battery back-up unit 586 discharges electrical back-up power to the backup electrical line 588, the diode 582 prevents power from the battery back-up unit 586 from flowing in a direction away from the electrical power bus 570. The battery backup unit 586 can be supported in one or more bays of a rack system 108 in the computing room 106, or can be supported elsewhere within the portable container 102. When the voltage on the second electrical line 568a of the electrical power bus 570 drops below a threshold voltage, due to, for example a failure of the first power source, the battery backup unit 586 can automatically become active, thereby supplying power to the electrical power bus 570. The battery backup unit 586 may provide back-up electrical power for as little as a few minutes to a few hours depending on the size and capacity of the battery backup unit 586, while a switch is made between the first electrical power source to the second electrical power source.

As described above, the first circuit breaker panel 556a can include a first branch circuit breaker 560a. The first branch circuit breaker 560a is configured to selectively connect the first cooling power circuit 575a to the first interconnect member 552a, and thus to the first external power source when the first external power source is electrically coupled to the first interconnect member 552a. For instance, when the first branch circuit breaker 560a is in a closed position, the first branch circuit breaker 560a establishes an electrical path from the first primary electrical line

554a to a first branch electrical line 577a of the first cooling power circuit 575a. When the first branch circuit breaker 560a is in an open position, the first branch circuit breaker 560a interrupts the electrical path from the first primary electrical line 554a to the first branch electrical line 577a, such that electrical power received at the first interconnect member 552a from the first external electrical power source is unable to flow to the first cooling power circuit 575a. The first main circuit breaker 558a and the first branch circuit breaker 560a can be configured to be in the open position simultaneously with each other, and can further be configured to be in the closed position simultaneously with each other. Further, the one of the first main circuit breaker 558a and the first branch circuit breaker 560a can be in the open position while the other of the first main circuit breaker 558a and the first branch circuit breaker 560a can be in the closed position.

Similarly, as described above, the second circuit breaker panel 556b can include a second branch circuit breaker 560b. The second branch circuit breaker 560b is configured to selectively connect the second cooling power circuit 575b to the second interconnect member 552b, and thus to the first external power source when the first external power source is electrically coupled to the second interconnect member 552b. For instance, when the second branch circuit breaker 560b is in a closed position, the second branch circuit breaker 560b establishes an electrical path from the second primary electrical line 554b to a second branch electrical line 577b of the second cooling power circuit 575b. When the second branch circuit breaker 560b is in an open position, the second branch circuit breaker 560b interrupts the electrical path from the second primary electrical line 554b to the second branch electrical line 577b, such that electrical power received at the second interconnect member 552b from the first external electrical power source is unable to flow to the second cooling power circuit 575b. The second main circuit breaker 558b and the second branch circuit breaker 560b can be configured to be in the open position simultaneously with each other, and can further be configured to be in the closed position simultaneously with each other. Further, the one of the second main circuit breaker 558b and the second branch circuit breaker 560b can be in the open position while the other of the second main circuit breaker 558b and the second branch circuit breaker 560b can be in the closed position.

The first and second cooling power circuits 575a and 575b can each include a common shared transfer switch 590, a common shared second electrical power bus 578, and a shared third electrical line 576 that is coupled between the transfer switch 590 and the second electrical power bus 578. The transfer switch 590 has inputs that are configured to couple, respectively, to the first and second branch electrical lines 577a and 577b. The transfer switch 590 has an output that is configured to couple to a third electrical line 576, and thus to the second electrical power bus 578. The transfer switch 590 is configured to selectively couple one of the first and second branch electrical lines 577a and 577b so as to place the one of the first and second branch electrical lines 577a and 577b in electrical communication with the third electrical line 576, and thus the second electrical power bus 578.

For instance, the transfer switch 590 can include an electrical contactor 591 that is configured to be placed in selective communication with one of the first and second branch electrical lines 577a and 577b. When the transfer switch 590 is in electrical communication with the first branch electrical line 577a, the first interconnect 552a is in electrical communication with the second electrical power bus 578, and the second interconnect 552b is electrically isolated from the second electrical power bus 578. When the transfer switch 590 is in electrical communication with the second branch electrical line 577b, the second interconnect 552b is in electrical communication with the second electrical power bus 578, and the first interconnect is electrically isolated from the second electrical power bus 578. Thus, the transfer switch 590 selectively connects one of the second electrical power bus 578 to the first and second main circuit breakers 558a and 558b. Thus, the transfer switch 590 may be operated in a first position "a" to connect the first branch electrical line 577a to the second electrical power bus 578 when power is being supplied by the first power source, and in a second portion "b" to connect the second branch electrical line 577b to the second electrical power bus 578 when power is not being supplied by the first power source (e.g., when the first power source has failed or maintenance is being performed on the first power source). The transfer switch 590 may be, as one example, a 300 Amp, make-before-break, automatic transfer switch (ATS).

The second electrical power bus 578 includes outputs configured to electrically connect to a second plurality of auxiliary electrical lines 180 that deliver electrical power to the cooling system, as described above. Because electrical current is configured to flow from the respective first and second circuit breaker panels 556a and 556b to the transfer switch 590 without first passing through respective rectifiers, electrical power traveling as alternating current can flow to the second electrical power bus 578. The second electrical power bus 578 is configured to distribute the received electrical power at the same voltage level as the source voltage level provided by the first and second external power sources. For instance, the second electrical power bus 578 is configured to distribute the received electrical power at 480 volts of alternating current to the second plurality of auxiliary electrical lines 180. The distributed electrical power can be at any amperage level as desired, such as 90 Amps.

Figure 7A:
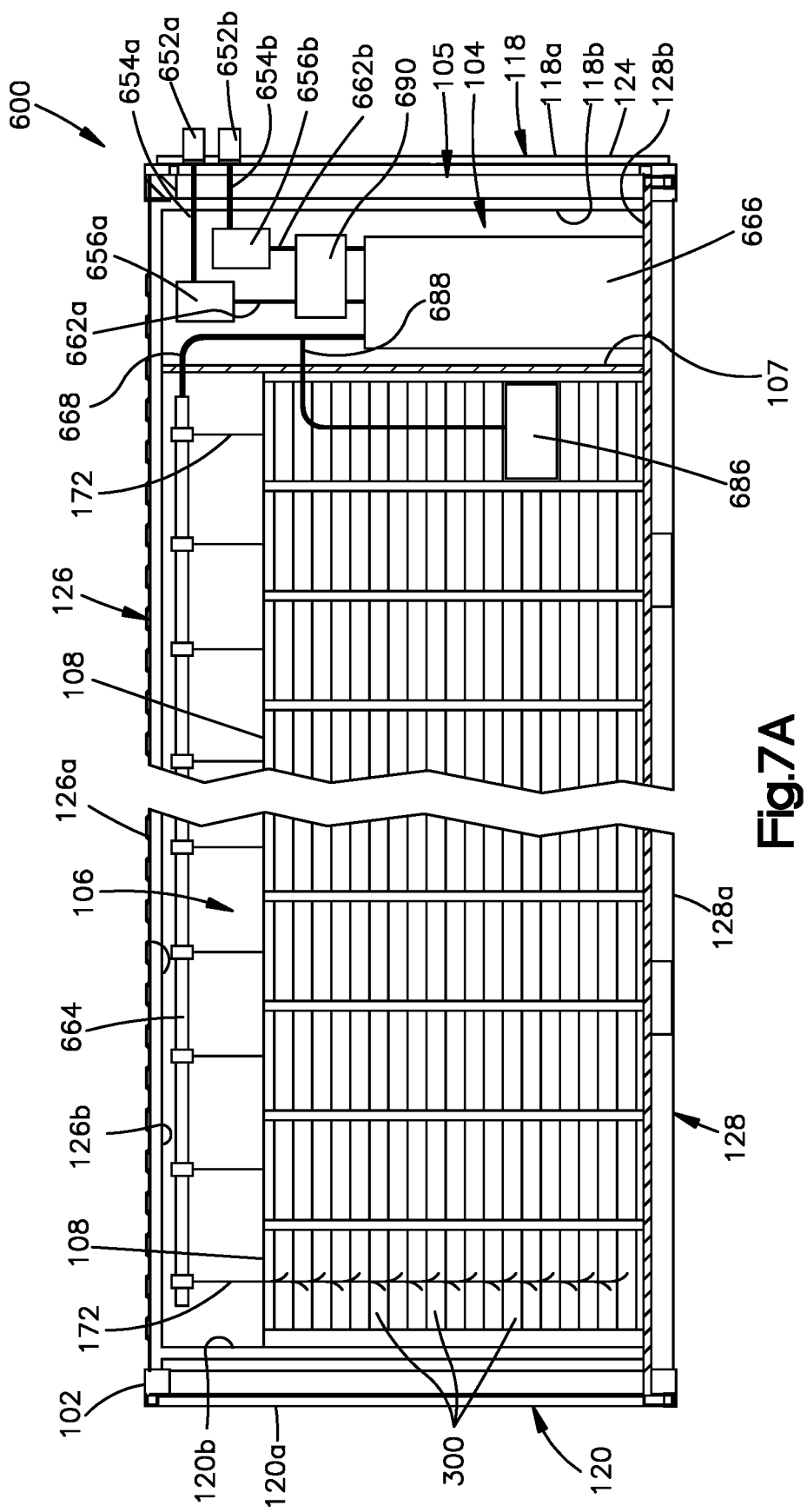
FIG. 7A is a sectional side elevation view of a portable data center constructed in accordance with yet still another embodiment.

Referring now to FIGS. 7A-7B, it is recognized that numerous alternative embodiments are envisioned in order to provide redundant electrical power sources to the rack systems 108 and the cooling system in a portable data center. In one example, a portable data center 600 includes the portable container 102 described above with respect to FIGS. 2A and 2B, which defines the internal cavity 104 and computing room 106. Accordingly, the portable data center 600 includes the rack systems 108, the computing devices 300, the one or more components 116 of the cooling system as described above, and an electrical power system 650, all of which are supported by the portable container 102. As described above with respect to FIGS. 6A-6B, the electrical power system 650 includes a transfer switch 690 that can be mounted to or supported by the portable container 102 in the internal cavity 104. The transfer switch 690 can be disposed inside or outside the computing room 106.

The electrical power system 650 can include first electrical power circuitry 655a that is configured to receive electrical power from the first electrical power source, and second electrical power circuitry 655b that is configured to receive electrical power from the second electrical power source. The first electrical power circuitry 655a, and thus the electrical power system 650, can include a first interconnect member 652a, a first circuit breaker panel 656a having a first circuit breaker 658a, and a first primary electrical line 654a electrically connected between the first interconnect member 652a and the first circuit breaker 658a. The first electrical power circuitry 655a, and thus the electrical power system 650, can further include a first electrical line 662a that is electrically coupled between the first circuit breaker 658a and the transfer switch 690. The first circuit breaker 658a is configured to selectively electrically connect the transfer switch 690 to the first interconnect member 652a, and thus to the external power source when the external power source is electrically coupled to the first interconnect member 652a. For instance, when the first circuit breaker 658a is in a closed position, the first circuit breaker establishes an electrical path from the first primary electrical line 654a to the first electrical line 662a. When the first circuit breaker 658a is in an open position, the first circuit breaker 658a interrupts the electrical path from the first primary electrical line 654a to the first electrical line 662a, such that electrical power received at the first interconnect member 652a is unable to flow to the transfer switch 690.

Similarly, the second electrical power circuitry 655b, and thus the electrical power system 650, can include a second interconnect member 652b, a second circuit breaker panel 656b having a second circuit breaker 658b, and a second primary electrical line 654b electrically connected between the second interconnect member 652b and the second circuit breaker 658b. The second electrical power circuitry 655b, and thus the electrical power system 650, can further include a second electrical line 662b that is electrically coupled between the second circuit breaker 658b and the transfer switch 690. The second circuit breaker 658b is configured to selectively electrically connect the transfer switch 690 to the second interconnect member 652b, and thus to the external power source when the external power source is electrically coupled to the second interconnect member 652b. For instance, when the second circuit breaker 658b is in a closed position, the second circuit breaker establishes an electrical path from the second primary electrical line 654b to the second electrical line 662b. When the second circuit breaker 658b is in an open position, the second circuit breaker 658b interrupts the electrical path from the second primary electrical line 654b to the second electrical line 662b, such that electrical power received at the second interconnect member 652b is unable to flow to the transfer switch 690.

The first and second electrical power circuits 655a and 655b share the transfer switch 665, and further share an electrical circuit 666, a first electrical power bus 670, and a battery back-up unit 686. When power from the first external power source is provided to the first electrical power circuit 655a, the first electrical line 662a provides the electrical power from the first circuit breaker panel 656a at a voltage level and amperage (e.g., from the first external source at 480 VAC, 300 A, 3 phase) to the transfer switch 690. Similarly, when power from the second external power source is provided to the second electrical power circuit 655b, the second electrical line 662b provides power from the second circuit breaker panel 656b at a voltage level and amperage (e.g., of the second external power source) to the transfer switch 665.

The transfer switch 690 thus has inputs that are configured to couple, respectively, to the first and second electrical lines 662a and 662b. The transfer switch 690 has an output that is configured to couple to an electrical circuit 666, such as a rectifier, over a switch output line 693 that is electrically connected between the transfer switch 690 and the electrical circuit 666. The electrical circuit 666 is in electrical communication with the first electrical power bus 670 over a third electrical line 668 that is electrically connected between the electrical circuit 666 and the first electrical power bus 670. The transfer switch 690 is configured to selectively couple one of the first and second electrical lines 662a and 662b so as to place the one of the first and second electrical lines 662a and 662b in electrical communication with the third electrical line 668, and thus the first electrical power bus 672.

For instance, the transfer switch 690 can include an electrical contactor 691 that is configured to be placed in selective communication with one of the first and second electrical lines 662a and 662b. When the transfer switch 690 is in electrical communication with the first electrical line 662a, the first interconnect member 652a is in electrical communication with the first electrical power bus 670, and the second interconnect 652b is electrically isolated from the first electrical power bus 670. When the transfer switch 690 is in electrical communication with the second electrical line 662b, the second interconnect member 652b is in electrical communication with the first electrical power bus 670, and the first interconnect member 652a is electrically isolated from the first electrical power bus 670. Thus, the transfer switch 690 selectively electrically connects the first electrical power bus 670 to one of the first and second circuit breakers 658a and 658b. Thus, the transfer switch 690 may be operated in a first position "a" to connect the first electrical line 662a to the first electrical power bus 670 when power is being supplied by the first power source, and in a second portion "b" to connect the second electrical line 662b to the first electrical power bus 670 when power is not being supplied by the first power source (e.g., when the first power source has failed or maintenance is being performed on the first power source). The transfer switch 690 may be, as one example, a 480 VAC (volts of alternating current) 300A, make-before-break, automatic transfer switch (ATS).

The electrical circuit 666 can include a rectifier that receives the electrical power over the switch output line 693 and produces output electrical power. The received electrical power can be at a first voltage level and a first amperage level that is provided by the first or second external electrical power source. For instance, the first voltage level can be 480 volts of alternating current, though it should be appreciated that the first voltage level can vary as desired. The first rectifier can convert the electrical power from alternating current (AC) to direct current (DC). Further, the first rectifier can output the direct current at a second voltage level that can be less than the first voltage level. For instance, the second voltage level can be between 350 volts and 480 volts of direct current. In one example, the second voltage can be 400 volts of direct current. Accordingly, it can be said that the electrical circuit 666 can vary a characteristic of the electrical power received over the switch output line 693. The characteristic can be a voltage level in one example. The characteristic can be the type of current flow (e.g., alternating current or direct current). Alternatively, as described above, the second voltage level can be equal to or greater than or equal to the first voltage level. The rectifier can be supported in a rectifier rack, which in turn is supported by the portable container 102 inside the internal cavity 104. The rectifier rack can be disposed within or outside the computing room 106 at any location as desired.

The output electrical power from the rectifier is provided to the first electrical power bus 670 over the third electrical line 668. The first electrical power bus 670 can be supported in the internal cavity 104. In one example, the first electrical power bus 670 can be supported in the computing room 106. The first electrical power bus 670 can be constructed as desired. In one example, the first electrical power bus 670 can be a Starline® Track Busway commercially available from Universal Electric Corporation, having a place of business in Canonsburg, Pa. The first electrical power bus 670 can include an input interface configured to electrically connect to the third electrical line 668, and a plurality of output interfaces that are configured to electrically connect to respective ones of the plurality of auxiliary electrical lines 172. Thus, the first electrical power bus 670 receives electrical power from the third electrical line 668 at the second voltage level. The output interfaces can be configured to deliver electrical power to the respective ones of the auxiliary electrical lines 172 at any suitable voltage as desired. For instance, the voltage delivered to the auxiliary electrical lines 172 can be less than the second voltage. In one example, the output interfaces are configured to deliver electrical power to the auxiliary electrical lines 172 at 400 volts of direct current at any suitable amperage level as desired. For instance, the amperage level can be 10 Amps or any suitable alternative amperage level as desired. In certain embodiments, the rectifier can be a first rectifier, and the electrical circuit 666 can further include a second rectifier that serves as a backup to the first rectifier and is operated when the first rectifier fails or is otherwise disabled.

Electrical power system 650 further includes a cooling power circuit 675 that is in selective electrical communication with one of the first interconnect member 652a and the second interconnect 652b. For instance, the cooling power circuit 675 can include a second electrical power bus 678 that includes outputs configured to electrically connect to a second plurality of auxiliary electrical lines 180 that deliver electrical power to the cooling system as described above. The cooling power circuit 675 further includes a branch electrical line 676 that is electrically connected to the switch output line 693. The cooling power circuit 675 further includes a cooling switch 674, such as a circuit breaker that can move between an open position that opens the branch electrical line 676 at a location between the switch output line 693 and the second electrical power bus 678, and a closed position that closes the branch electrical line 676. Thus, when the cooling switch 674 is in the open position, the transfer switch 690 is electrically isolated from the second electrical power bus 678. When the cooling switch 674 is in the closed position, the transfer switch 690 is in electrical communication with the second electrical power bus 678.

It is anticipated that, upon an outage of the first external electrical power source, it will be desirable to maintain adequate electrical power flow to the first electrical power bus 670 while switching from the first electrical power source to the second electrical power source. Accordingly, the electrical power system 650 can include a battery back-up unit 686 that is configured to provide electrical back-up power to the first electrical power bus 670, for instance when each of the first electrical power source and the second electrical power source fails to output a predetermined minimum amount of electrical power to the electrical power system 550, which may occur when transitioning from the first external electrical power source to the second external electrical power source. In one example, the battery backup unit 686 can be configured as an in-row lithium-ion battery, or any suitable portable source of electrical power as desired. The electrical power system 650 can include a backup electrical line 688 that is coupled between the third electrical line 668 and the battery backup unit 686. Accordingly, the electrical back-up power can flow under direct current from the battery backup unit to the first electrical power bus 570. During operation, when the voltage on the first electrical power bus 670 drops below a threshold voltage, due to, for example a failure of the first external power source, for instance when transferring from the first external power source to the second external power source, the battery backup unit 686 can automatically become active, thereby supplying electrical power to the first electrical power bus 670. The battery backup unit 686 may provide the electrical back-up power for as little as a few minutes to a few hours depending on the size and capacity of the battery backup unit 686, while a switch is made between the first external electrical power source to the second external electrical power source. When the electrical power bus 670 is not drawing electrical back-up power from the battery back-up unit 586, the battery back-up unit 686 can draw electrical power from the electrical circuit 666 so as to charge the battery back-up unit 686.

Figure 7C:
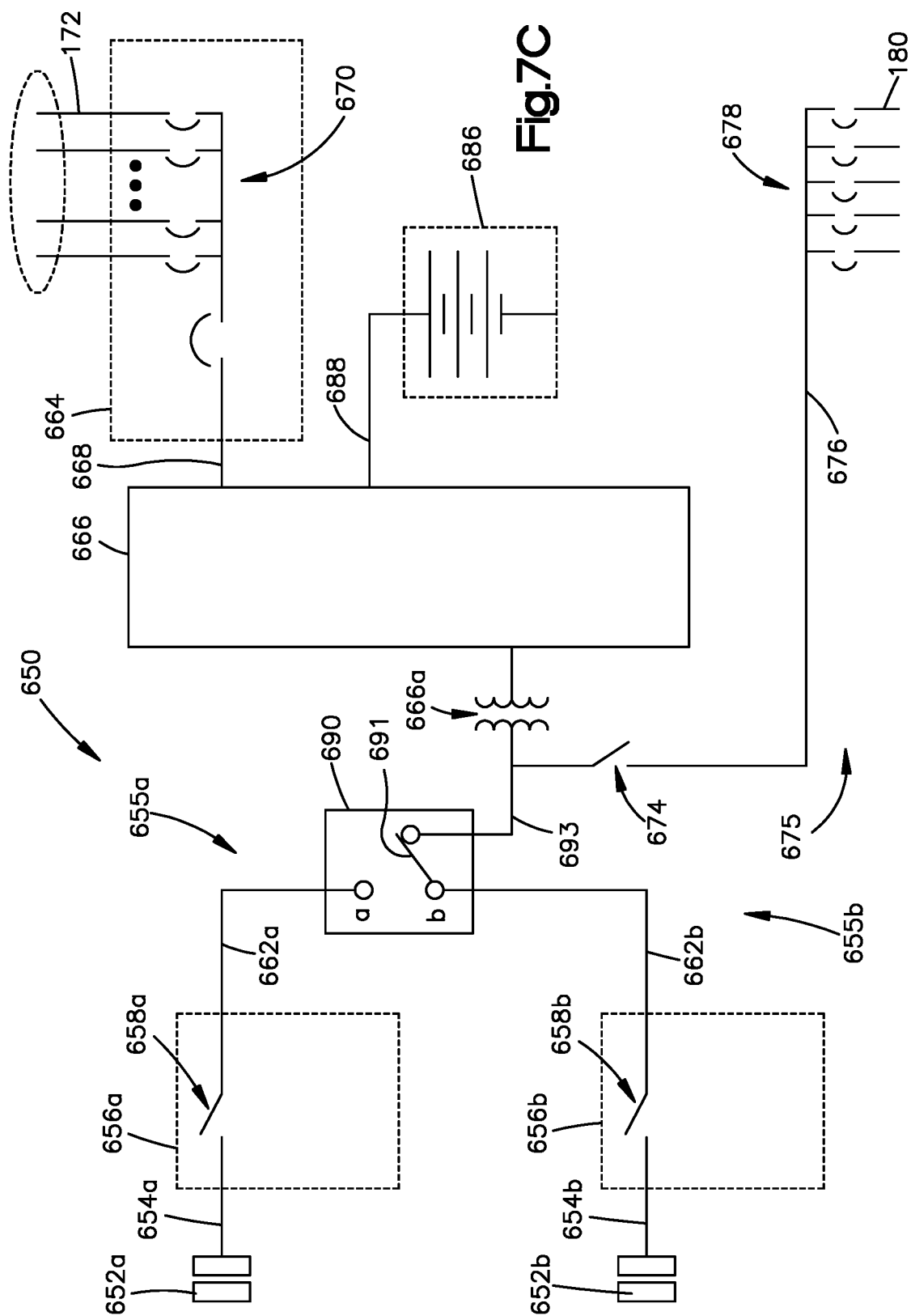
FIG. 7C is a schematic diagram of the electrical power system illustrated in FIG. 7B, but constructed in accordance with an alternative embodiment.

Referring now to FIG. 7C, the electrical power system 650 can further include an isolation transformer 666a disposed on the switch outlet line 693 at a location between the transfer switch 690 and the electrical circuit 666. In particular, the isolation transformer 666a can be disposed between the branch electrical line 676 and the electrical circuit 666. The isolation transformer 666a can be configured as described above with respect to the isolation transformer illustrated in FIG. 5B. The battery back-up unit 686 can further be configured to provide electrical power to the electrical circuit 666. For instance, the back-up electrical line 688 can be connected between the battery-back up unit 686 and an input of the electrical circuit 666. It should be appreciated that the electrical circuit 666 can include at least one rectifier and at least one inverter. For instance, in the event that the first electrical power bus 670 is an alternating current power bus, the at least one rectifier in the electrical circuit can convert the alternating current from the power source to direct current in order to charge the battery back-up unit 686. When the battery back-up unit 686 discharges electrical back-up power, the at least one inverter can convert the power from the battery backup unit to alternating current, which can then travel to the electrical power bus 670.

Referring to FIGS. 2D-7C generally, it should be appreciated that a method can be provided for powering a portable data center that comprises a portable container defining an interior supporting a plurality of rack systems. The method can include the step of coupling a first power source that is external to the portable data center to a first interconnect member of the portable data center so as to receive source electrical power. For instance, the coupling step can further include the steps of coupling a second power source that is external to the portable data center to a second interconnect member of the portable data center, and switching between the first power source and the second power source so as to receive the source electrical power from one of the first power source and the second power source. The method can further include the steps of varying a characteristic of the source electrical power in the interior so as to produce output electrical power, and distributing the output electrical power to respective ones of a plurality of computing devices supported by the rack systems.

The various features and processes described above may be used independently of one another, or may be combined in various ways. All possible combinations and sub-combinations are intended to fall within the scope of this disclosure. In addition, certain methods or process blocks may be omitted in some implementations. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel, or in some other manner. Blocks or states may be added to or removed from the disclosed example embodiments. The example systems and components described herein may be configured differently than described. For example, elements may be added to, removed from, or rearranged compared to the disclosed example embodiments.

It will also be appreciated that various items are illustrated as being stored in memory or on storage while being used, and that these items or portions thereof may be transferred between memory and other storage devices for purposes of memory management and data integrity. Alternatively, in other embodiments some or all of the software modules and/or systems may execute in memory on another device and communicate with the illustrated computing systems via inter-computer communication. Furthermore, in some embodiments, some or all of the systems and/or modules may be implemented or provided in other ways, such as at least partially in firmware and/or hardware, including, but not limited to, one or more application-specific integrated circuits ("ASICs"), standard integrated circuits, controllers (e.g., by executing appropriate instructions, and including microcontrollers and/or embedded controllers), field-programmable gate arrays ("FPGAs"), complex programmable logic devices ("CPLDs"), etc. Some or all of the modules, systems and data structures may also be stored (e.g., as software instructions or structured data) on a computer-readable medium, such as a hard disk, a memory, a network, or a portable media article to be read by an appropriate device or via an appropriate connection. The systems, modules and data structures may also be transmitted as generated data signals (e.g., as part of a carrier wave or other analog or digital propagated signal) on a variety of computer-readable transmission media, including wireless-based and wired/cable-based media, and may take a variety of forms (e.g., as part of a single or multiplexed analog signal, or as multiple discrete digital packets or frames). Such computer program products may also take other forms in other embodiments. Accordingly, the present invention may be practiced with other computer system configurations.

It should be appreciated that a method can be provided for powering a portable data center that defines an interior supporting a plurality of rack systems, each of the rack systems supporting at least one computing device. The method can include the step of coupling an interconnect member of the portable data center to a first power source that is external to the portable data center so as to receive source electrical power. The method can further include the step of directing the source electrical power through at least one an electrical circuit that is disposed in the interior of the portable data center. The method can further include the step of varying a characteristic of the source electrical power at the electrical circuit so as to produce output electrical power from the at least one electrical circuit. For instance, the step of varying can include the step varying a voltage level of the source electrical power. Alternatively or additionally, the step of varying can include the step of changing the source electrical power from one of alternating current and direct current to the other of alternating current and direct current. The method can further include the step of directing the output electrical power from the at least one electrical circuit to an electrical power bus that is electrically coupled to the at least one computing device supported by each of the plurality of rack systems. The method can further include the step of distributing the output electrical power from the electrical power bus to the at least one computing device of each of the plurality of rack systems. The method can further include the steps of coupling a second interconnect member of the portable data center to a second power source that is external to the portable data center, and switching from the first power source to the second power source so as to direct the source electrical power from the second power source through the at least one electrical circuit. The method can further include the step of discharging electrical back-up power from a battery-backup when each of the first and second power sources fails to produce a predetermined minimum amount of electrical power to the electrical power bus. The method can further include the steps of directing electrical power from the first power source to powered cooling components configured, generating cold air at the powered cooling components, and causing the cold air to be input by the at least one computing device of each of the rack systems.

It should be further appreciated that a method can be provided for powering a portable data center that defines an interior supporting a plurality of rack systems. The method can include the step of coupling an interconnect member of the portable data center to a first power source that is external to the portable data center so as to receive source electrical power. The method can further include the step of directing the source electrical power through at least one an electrical circuit that is disposed in the interior of the portable data center. The method can further include the step of varying a characteristic of the source electrical power at the at least one electrical circuit so as to produce output electrical power from the at least one electrical circuit. The step of varying can include the step of reducing a voltage level of the source electrical power. The step of varying can include the step of changing the source electrical power from one of alternating current and direct current to the other of alternating current and direct current. The method can further include the step of directing the output electrical power from the at least one electrical circuit to an electrical power bus that is configured to be electrically coupled to at least one of the plurality of rack systems. The method can further include the step of distributing the output electrical power from the electrical power bus to at least one computing device supported by the at least one of the plurality of rack systems. The step of directing the source electrical power through at least one an electrical circuit can include the step of directing the source electrical power to an electrical power distribution unit that performs the varying step, the directing step, and the distributing step. The method can further include the steps of coupling a second interconnect member of the portable data center to a second power source that is external to the portable data center, and switching from the first power source to the second power source so as to direct the source electrical power from the second power source through the at least one electrical circuit.

The method can further include the step of discharging electrical back-up power from a battery-backup when each of the first and second power sources fails to produce a predetermined minimum amount of electrical power to the electrical power bus. The method can further include the step of directing at least a portion of the source electrical power to the battery-backup so as to apply a charge to the battery back-up. The method can further include the step of preventing the electrical back-up power from flowing in a direction toward the first and second interconnect members.

The method can further include the step of actuating a transfer switch that is housed in the interior so as to selectively couple the at least one electrical circuit and one of the first and second interconnect members. The method can further include the step of actuating a cooling switch between an open position whereby the transfer switch is electrically isolated from a second electrical power bus, and a closed position whereby the transfer switch is in electrical communication with the second electrical power bus, wherein the second electrical power bus has a second plurality of electrical lines, each configured to supply power to at least one cooling component of a cooling system. The method can further include the step of actuating a main circuit breaker between an open position whereby the main circuit breaker electrically isolates the first interconnect member from the at least one electrical circuit, and a closed position whereby the main circuit breaker places the first interconnect member in electrical communication with the at least one electrical circuit. The method can further include the step of actuating a branch circuit breaker between an open position whereby the branch circuit breaker electrically isolates the first interconnect member from the at least one cooling component, and a closed position whereby the main circuit breaker places the first interconnect member in electrical communication with the at least one cooling component.

It should be noted that the illustrations and descriptions of the embodiments shown in the figures are for exemplary purposes only, and should not be construed limiting the disclosure. One skilled in the art will appreciate that the present disclosure contemplates various embodiments. Additionally, it should be understood that the concepts described above with the above-described embodiments may be employed alone or in combination with any of the other embodiments described above. It should further be appreciated that the various alternative embodiments described above with respect to one illustrated embodiment can apply to all embodiments as described herein, unless otherwise indicated.

Unless explicitly stated otherwise, each numerical value and range should be interpreted as being approximate as if the word "about" or "approximately" preceded the value or range.

It should be understood that the steps of exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments.

Although the elements in the following method claims are recited in a particular sequence with corresponding labeling, unless the claim recitations otherwise imply a particular sequence for implementing some or all of those elements, those elements are not necessarily intended to be limited to being implemented in that particular sequence.

What is claimed:

1. A portable data center comprising:
   a portable container defining an internal cavity that contains a computing room;
   a plurality of rack systems supported in the computing room and configured to support a plurality of computing devices; and
   an electrical power system that includes:
   a first interconnect member supported by the portable container, the first interconnect member configured to couple to a first power source that is external to the portable container, the first interconnect member configured to receive electrical power from the first power source;
   a second interconnect member configured to couple to a second power source that is external to the portable container, the second interconnect member configured to receive electrical power from the second power source;
   at least one electrical circuit disposed entirely in the internal cavity, the at least one electrical circuit configured to be selectively placed in electrical communication with the first interconnect member or the second interconnect member, wherein the at least one electrical circuit is configured to receive the electrical power from the first or second power source, respectively, vary a characteristic of the received electrical power, and produce output electrical power;
   an electrical power bus disposed entirely in the internal cavity, the electrical power bus electrically connected to the at least one electrical circuit so as to receive the output electrical power from the at least one electrical circuit; and
   a plurality of electrical lines in electrical communication with the electrical power bus, each of the plurality of electrical lines configured to supply power from the output electrical power to a respective at least one computing device of at least one of the plurality of rack systems;
   wherein the electrical power bus is electrically connected to a high voltage direct current (DC) power source to supply a high voltage DC power to the at least one rack system, and
   wherein the DC power source supplies automated backup electrical power directly to the electrical power bus.

2. The portable data center of claim 1, wherein the at least one electrical circuit comprises an isolation transformer.

3. The portable data center of claim 2, wherein the electrical power system further comprises an electrical power distribution unit that contains the isolation transformer and the electrical power bus.

4. The portable data center of claim 1, further comprising a battery backup unit that is configured to supply backup power to the electrical power bus when each of the first and second power sources fails to produce a predetermined minimum amount of electrical power to the electrical power system.

5. The portable data center of claim 1, further comprising powered cooling components configured to generate cold air that is input to the plurality of computing devices, wherein the electrical power system is configured to provide the electrical power from at least one of the first power source or the second power source to the powered cooling components.

6. The portable data center as recited in claim 1, wherein the high voltage DC power source is between about 350 and 480 volts.

7. The portable data center as recited in claim 6, wherein the high voltage DC power source is about 400 volts.

8. A portable data center comprising:
   a portable container defining an interior that contains a plurality of rack systems configured to support at least one computing device; and an electrical power system comprising:
- a first interconnect member supported by the portable container and configured to couple to a first power source that is external to the portable container;
- a second interconnect member configured to couple to a second power source that is external to the portable container, the second interconnect member configured to receive electrical power from a second power source;
- at least one electrical circuit disposed in the interior and configured to receive electrical power from the first power source, vary at least one characteristic of the electrical power, and produce output electrical power; and
- an electrical power bus disposed in the interior, the electrical power bus configured to be selectively placed in electrical communication with the first interconnect member or the second interconnect member so as to receive electrical power from the first or second power source, respectively and electrically connect to a plurality of auxiliary electrical lines, each of the plurality of auxiliary electrical lines configured to supply a portion of the output electrical power to a respective at least one of the rack systems,
- wherein the electrical power bus is electrically connected to a high voltage direct current (DC) power source to supply a high voltage DC power to the at least one rack system, and
- wherein the DC power source supplies automated backup electrical power directly to the electrical power bus.

9. The portable data center of claim 8, wherein the characteristic is a voltage level.

10. The portable data center of claim 8, wherein the characteristic is a type of electrical current of the electrical power.

11. The portable data center of claim 8, wherein the at least one electrical circuit comprises an isolation transformer.

12. The portable data center of claim 11, wherein the electrical power system further comprises an electrical power distribution unit that contains the transformer and the electrical power bus.

13. The portable data center of claim 8, wherein the at least one electrical circuit comprises at least one of a rectifier and an inverter.

14. The portable data center of claim 8, wherein the portable data center further comprises a battery backup unit disposed in the interior and electrically coupled to the electrical power bus, wherein the battery backup unit is configured to supply backup power to the electrical power bus when each of the first and second power sources fails to produce a predetermined minimum amount of electrical power to the electrical power system.

15. The portable data center of claim 8, further comprising a diode coupled between the at least one electrical circuit and the electrical power bus, and wherein the diode is electrically connected to an electrical line that electrically connects the at least one electrical circuit and the electrical power bus.

16. The portable data center of claim 14, wherein:
- the electrical power system further comprises a transfer switch housed in the interior and coupled between (i) the first and second interconnect members and (ii) the at least one electrical circuit; and
- the transfer switch is configured to selectively connect the first power source or the second power source to the at least one electrical circuit.

17. The portable data center of claim 16, further comprising:
- a second electrical power bus disposed in the interior, the second electrical power bus having a second plurality of electrical lines, each configured to supply power to one or more components of a cooling system; and
- a cooling switch disposed between the transfer switch and the second electrical power bus, the cooling switch operable between an open position whereby the second electrical power bus is electrically isolated from the transfer switch, and a closed position whereby the second electrical power bus is in electrical communication with the transfer switch.

18. The portable data center of claim 8, further comprising:
- a main circuit breaker disposed between the first interconnect member and the at least one electrical circuit, the main circuit breaker operable between an open position, whereby the main circuit breaker electrically isolates the first interconnect member from the at least one electrical circuit, and a closed position, whereby the main circuit breaker places the first interconnect member in electrical communication with the at least one electrical circuit; and
- a branch circuit breaker disposed between the first interconnect member and at least one powered cooling component that is configured to deliver cold air to the rack systems to be circulated through the at least one computing device, the branch circuit breaker operable between an open position whereby the branch circuit breaker electrically isolates the first interconnect member from the at least one powered cooling component, and a closed position whereby the main circuit breaker places the first interconnect member in electrical communication with the at least one powered cooling component.

19. The portable data center as recited in claim 8, wherein the high voltage DC power source is between about 350 and 480 volts.

20. An apparatus comprising:
- a movable container, the movable container defining a cavity, the cavity being configured to mount computing servers;
- an electrical connector mounted to the movable container, the electrical connector being configured to couple to a power source external to the movable container;
- a second electrical connector configured to couple to a second power source that is external to the movable container, the second electrical connector configured to receive electrical power from a second power source;
- a power circuit, the power circuit being disposed in the cavity and being configured to be selectively placed in electrical communication with the electrical connector or the second electrical connector and modify power received through the electrical connector or the second electrical connector; and
- a power bus, the power bus being disposed in the movable container and being configured to provide the modified power to first and second power lines,
- wherein the power bus is electrically connected to a high voltage direct current (DC) power source to supply a high voltage DC power to the at least one rack system, and wherein the DC power source supplies automated backup electrical power directly to the power bus.

21. The apparatus of claim 20, the movable container having approximately the same dimensions as a shipping container.

22. The apparatus as recited in claim 20, wherein the high voltage DC power source is between about 350 and 480 volts.

* * * * *